US006946054B2

(12) United States Patent
Brcka

(10) Patent No.: US 6,946,054 B2
(45) Date of Patent: Sep. 20, 2005

(54) MODIFIED TRANSFER FUNCTION DEPOSITION BAFFLES AND HIGH DENSITY PLASMA IGNITION THEREWITH IN SEMICONDUCTOR PROCESSING

(75) Inventor: Jozef Brcka, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/080,496

(22) Filed: Feb. 22, 2002

(65) Prior Publication Data

US 2003/0159782 A1 Aug. 28, 2003

(51) Int. Cl.$^7$ .............................. C23C 16/00; C23F 1/00
(52) U.S. Cl. .............................. 156/345.48; 118/723 I
(58) Field of Search .................. 118/723 I, 723 IR, 118/723 AN, 723 MW, 723 ME, 723 MR, 723 MA; 156/345.48, 345.49, 345.41, 345.42, 345.36; 315/111.51; 204/298.06, 298.11, 298.34

(56) References Cited

U.S. PATENT DOCUMENTS

| | | | |
|---|---|---|---|
| 3,974,059 A | 8/1976 | Murayama | |
| 4,431,901 A | 2/1984 | Hull | |
| 5,178,739 A | 1/1993 | Barnes et al. | |

(Continued)

FOREIGN PATENT DOCUMENTS

| | | |
|---|---|---|
| WO | WO98/11594 | 3/1998 |
| WO | WO99/25494 | 5/1999 |
| WO | WO99/26267 | 5/1999 |
| WO | WO99/29923 | 6/1999 |
| WO | WO00/49638 | 8/2000 |

OTHER PUBLICATIONS

Smithe et al., *Calculation of magnetic shielding and ohmic losses from finite thickness Faraday shields used in RF heating of plasmas*, J. Appl. Phys. 59 (12) 1986, pp. 3980–3989.

Faulconer, *Adverse shielding of the heating field and high ohmic loss introduced by electrostatic shields employed in radio-frequency heating of plasma*, J. Appl. Phys. 54 (7) 1983, pp. 3810–3817.

Primary Examiner—Luz Alejandro-Mulero
(74) Attorney, Agent, or Firm—Wood, Herron & Evans, L.L.P.

(57) ABSTRACT

An improved deposition baffle, that is provided to protect a dielectric window from conductive deposits, is provided in high-density-plasma apparatus having slots with features therein which spatially distribute the transmitted RF power density through a baffle. The features form connections and current paths across the slot boundaries on the side of the baffle that faces the plasma, away from the window through which a coil couples RF power, thereby minimizing interference with the inductive coupling. In one embodiment, bridges across the slots on the plasma side of the baffle improve the flux distribution through the baffle. In another embodiment, blades in and parallel to the slots, on the coil side of the baffle but which are supported by connections on the plasma side of the baffle, reduce the formation of plasma in the slots and prevents resputtering of material from the slot boundaries. In a plasma source with a deposition baffle, plasma is ignited at low power levels within a wide pressure range up to 20 mTorr with a combination of RF power of at least 300 watts, but less than 600 watts, and the ramping of DC power on a target or other electrode from 0 watts to up to a level of not more than approximately 20 watts over a period of several seconds.

31 Claims, 13 Drawing Sheets

U.S. PATENT DOCUMENTS

| | | |
|---|---|---|
| 5,231,334 A | 7/1993 | Paranjpe |
| 5,234,529 A | 8/1993 | Johnson |
| 5,449,433 A | 9/1995 | Donohoe |
| 5,534,231 A | 7/1996 | Savas |
| 5,763,851 A | 6/1998 | Forster et al. |
| 5,830,330 A * | 11/1998 | Lantsman ............... 204/192.12 |
| 5,900,699 A | 5/1999 | Samukawa et al. |
| 5,903,106 A | 5/1999 | Young et al. |
| 5,968,327 A | 10/1999 | Kobayashi et al. |
| 6,006,694 A | 12/1999 | DeOrnellas et al. |
| 6,033,585 A * | 3/2000 | Wicker et al. ................. 216/68 |
| 6,056,848 A | 5/2000 | Daviet |
| 6,080,287 A | 6/2000 | Drewery et al. |
| 6,156,164 A | 12/2000 | Smolanoff et al. |
| 6,170,431 B1 | 1/2001 | DeOrnellas et al. |
| 6,173,674 B1 | 1/2001 | DeOrnellas et al. |
| 6,190,512 B1 | 2/2001 | Lantsman |
| 6,197,165 B1 * | 3/2001 | Drewery et al. ....... 204/192.12 |
| 6,248,251 B1 | 6/2001 | Sill |
| 6,287,435 B1 | 9/2001 | Drewery et al. |
| 6,523,493 B1 * | 2/2003 | Brcka ...................... 118/723 I |
| 6,652,711 B2 * | 11/2003 | Brcka et al. ........... 156/345.48 |

* cited by examiner

MODIFIED TRANSFER FUNCTION DEPOSITION BAFFLES AND HIGH DENSITY PLASMA IGNITION THEREWITH IN SEMICONDUCTOR PROCESSING

This invention is related to U.S. Pat. Nos. 6,080,287 and 6,287,435 and to pending U.S. patent application Ser. No. 09/629,515, filed Aug. 1, 2000, all hereby expressly incorporated by reference herein.

FIELD OF THE INVENTION

This invention relate to inductively-coupled plasma (ICP) sources used in the processing of semiconductors. The invention is particularly applicable to high-density inductively-coupled plasma (HDICP) sources in which RF energy is inductively coupled through a dielectric material hat is protected by a slotted deposition baffle to energize a plasma for depositing electrically conductive material onto, or etching an electrically conductive material from, a semiconductor wafer.

BACKGROUND OF THE INVENTION

Inductively coupled sources are becoming widely used for processing systems used in semiconductor manufacturing. Typical ICP sources employ an antenna that couples RF energy into a working, or processing, gas in a vacuum chamber, thus exciting a plasma in the gas. Such sources further employ an electrically insulating window or other electrically insulating material barrier between the antenna and the processing zone. A window, where used, may provide a barrier between atmospheric air and the vacuum of the chamber. Early use of high frequency coils for ionization of evaporated particles of coating material is described in U.S. Pat. No. 3,974,059 and 5,178,739.

In ICP semiconductor processing systems, the ICP source is an integral part of the vacuum chamber that contains the working or processing gas that is used for processing of the semiconductor wafers. For metal deposition and etching applications, a dielectric window or other electrically insulating structure has to be protected from plasma to avoid building-up conductive coatings on the surface of the insulating material that could prevent efficient RE power delivery into the plasma. Surface protection of the insulating material is provided by a structural device, namely, a deposition baffle placed between the plasma and the insulating material. The electrically insulating material is referred to hereafter as a window. Such a window is typically formed of a dielectric material such as ceramic. Deposition baffles made of slotted shields are described in U.S. Pat. Nos. 4,431,901; 4,795,879; 4,897,579; 5,231,334; 5,234,529; 5,449,433 and 5,534,231. Their use in ionized physical vapor deposition (iPVD) systems is described in U.S. Pat. Nos. 5,800,688 and 5,948,215, using cylindrical sources, and in U.S. Pat. Nos. 6,080,287 and 6,287,435 using planar flat and three-dimensional antennae.

A deposition baffle device or shield in a plasma processing system serves several purposes. Such a shield can provide protection, from plasma radiation, contamination and sputtering, for a dielectric window when the antenna is placed at the atmospheric side of the window, and for the antenna itself when the antenna is placed in the vacuum. In a metal deposition apparatus, such a shield may prevent the deposition of a conductive coating onto the surface of the dielectric window. The baffle or shield device is generally preferred to be opaque to the electrostatic fields but transparent to the electromagnetic fields, so that the device prevents electrostatic coupling of RF energy from the antenna to the plasma but allows magnetic coupling of the energy for the excitation of plasma. From the coupling efficiency standpoint, it is desirable to minimize the image currents on the shield so that energy is not wasted in joule heating of the shield.

Typically, a single design for a deposition baffle or shield cannot fully optimize all these aspects at once and so involves many trade-offs of these various requirements. For example, a shield that produces the least loss and is most transparent to electromagnetic fields is no shield at all. On the other hand, a perfect electrostatic and particle shield would entail complete enclosure of the antenna or dielectric window within a grounded case to separate it from the plasma environment, allowing no coupling at all. Optimization of a shield design is even more difficult when utilizing an antenna with a complex shape and structure rather than one in the form of a simple RF strip.

A uniform spatial coupling efficiency is desirable for a deposition baffle, particularly in plasmas used for processing of large diameter semiconductor wafers, because of a need for symmetric (at least, azimuthally uniform) RF power coupling into the plasma inside the chamber. Non-symmetric plasma tends to produce more contamination and erosion of hardware parts near the plasma source, including producing an irregular target sputter etch rate due to azimuthally non-uniform ion flux, which thereby produces a non-uniform etch or deposition. Usually, overall dimensions of a processing apparatus must be limited to several tens of centimeters, as there are requirements or at least preferences to keep a small footprint for the processing tool. Size limitations prevent enough space for using large components to keep the ends, edges and other irregular structural features away from critical locations.

For example, hot spots have been observed in deposition baffles close to the ends of slots, producing a locally more intense plasma, and as a result, locally enhanced erosion of the target has occurred. Non-uniform target erosion shortens the life of a target and thus increases the cost of ownership of the tool. Moreover, a non-uniform erosion rate may produce an oval or other irregular pattern in the film deposited on the substrate formed by a varying thickness of the deposited film on the substrate.

An important property of a deposition baffle is its transparency to electromagnetic fields. Slots allow azimuthal magnetic flux, which is produced by currents flowing in the conductors of an antenna that encircle the conductors in planes normal to the conductors, to pass through the baffle. An electric field is induced across the gaps between adjacent slots of the baffle that border the slots, which is in a direction such that it supports E×B movement of flux from the gap and away from the antenna. The transmission coefficient may reach values up to the 0.8–0.9 range. An electrically conductive deposition baffle, however, can produce two adverse effects on antenna-to-plasma coupling properties: (1) magnetic shielding of the antenna current $I_a$, and (2) possible significant ohmic losses. Both effects are stronger when magnetic flux normal to the surface o the baffle is increased.

Electrostatic shielding provided by a deposition baffle between the coil and the processing zone in the chamber makes it difficult to ignite plasma in an ICP reactor, especially at low pressures. In such case new procedures have to be developed to provide plasma ignition that is safe for the operating personnel, will not damage the hardware and will not interfere with the process or damage the substrates being processed.

The initial ionization of gas in the chamber requires a high enough voltage to cause electron and ion generation from neutral atoms. Further, to maintain the plasma, at least as many atoms hay to be ionized to produce ions and electrons as are lost by collisions within the chamber space or with the chamber walls. If too many electrons are lost, the plasma collapses or is never formed. A well-designed deposition baffle shields most of the electric field from the antenna and makes it difficult to ignite a plasma by an electric field ram the antenna. Increasing the RF current through the antenna to produce strange electric fields in its vicinity can result in high voltage at the antenna that can produce a atmospheric discharge outside of the chamber, and thus unsafe operation and potential component damage. Further, the lower the pressure in the chamber, the more difficult is plasma ignition.

In ICP plasma sources with slotted shields, increasing the opening of one of the slots in the shield can improve ignition, but this is not practical where dielectric window contamination is to be avoided. In systems having a target, it is possible to strike a plasma by DC power applied to the target. However, this may produce significant damage to the wafer being processed due to a high voltage spike at a powered electrode that can lead to unstable oscillations in the form of very large voltage perturbations that would continue until a threshold voltage is achieved and overcome, at which point full transition to the plasma would occur.

SUMMARY OF THE INVENTION

An objective of the present invention is to remove azimuthal non-uniformity in a plasma in ICP processing systems, and particularly to eliminate local erosion of the target and provide more uniform deposition on the substrate in ICP-iPVD systems by removing such azimuthal plasma non-uniformities.

Another objective of the present invention is to optimize the transfer function of a deposition baffle in an ICP processing system to provide more uniform distribution of the RF power being transferred into plasma through the baffle.

Still another objective of the present invention is to improve window protection from coating contamination.

A further objective of the present invention is to azimuthally improve the cooling of a deposition baffle, and particularly to thereby reduce flaking of deposited material inside of slots in the baffle.

A still further objective of the present invention is to provide both ignition of the plasma and a safe ignition procedure at low power and low pressure conditions.

According to principles of the present invention, the slots of a deposition baffle in an ICP reactor are provided with features or elements that improve the uniformity of the distribution of power coupled into the plasma through the baffle without limiting the effectiveness of inductive coupling through the baffle.

According to other principles of the invention, the slots of a deposition baffle in an ICP reactor are provided with features that limit the formation of plasma in the slots and limit the emission of material from the slots and onto the dielectric window that is to be protected by the baffle.

According to further principles of the invention, a deposition baffle in an ICP reactor is constructed with different features and geometries in the side of the slot facing the chamber or plasma side of the baffle than on the side of the slot facing the window side of the baffle.

In certain embodiments of the invention, the effects of the ends of the slots of the baffle are distributed evenly over the surface of the baffle by electrically conductive bridges across the slots of the baffle. Preferably, such bridges are provided on the chamber side of the baffle, that is the side that faces toward the plasma, where their limiting effects on the transparency of the baffle to magnetic fields are minimized. Alternatively, or in addition, an increased transparency to RF is provided by an increased number of the slots. In increasing the number of slots, the slot number and configuration can be selected so that the resonant frequency of the coil-baffle RF circuit is close to that of the RF energy source powering the coil.

By placing the bridges on the plasma side of the deposition baffle they partially eliminate the return current path on the window side of the baffle and avoid being seen directly by the antenna, minimizing interference between the bridges and the antenna. Further, the bridges enhance RF ground of the central portion of the shield, enhance shielding of the window from particles coming in a direction parallel to the slots, and create thermal channels in a direction normal to the slots. Moreover, the bridges help compress the RF magnetic field in the plasma side of the deposition baffle. Further, the pattern of the bridges lies and is distributed over the plane of the deposition baffle, which gives them a uniform effect on conditions in plasma.

Further, the antenna and deposition baffle are setup in approximate resonance as a parallel LRC circuit by configuring the number of slots. Under such conditions, maximal RF power is deposited into the plasma.

According to other embodiments of the invention, coating of the dielectric window by plasma products and metal atoms is minimized by providing slots having no line-of-sight path to the window from the plasma, and also with a configuration that prevents the formation of plasma in the slots and the resputtering of deposits from the slots and onto the window. This is achieved without reducing the transparency of the slots to the magnetic fields from the coil. Preferably, blades or other structures are provided in the slots to reduce the mean free path of gas atoms to less than the critical dimensions of the slot. Such structures are connected to the baffle body in such a way as to minimize providing increased paths for induced currents on the baffle.

The blades or other plasma excluding structures in the slots are located within the slot portion that is near the dielectric window. The blade connections to the baffle body, however, are located toward the plasma side of the baffle so as to avoid providing induced current paths or to otherwise affect the impedance of the antenna. These structures are preferably thin blades in the form of narrow slats or lamellas with a thickness of around 1 mm or less, and are placed within the slots on the side thereof that is close to the dielectric window.

The RF magnetic field from the antenna is not directly affected by thin blades and their connections placed toward the plasma side of the baffle, as their effect is partially shielded by the body of the deposition baffle itself. A planar pattern of blade connections in the plane of the deposition baffle provides uniform effects on conditions of the plasma.

According to certain embodiments of the invention, plasma is ignited and sustained at a low RF power coupled to the antenna and a DC power level at the target of only a few watts, for example, 0 to 20 watts. Specifically, plasma ignition may be carried out with DC power of 4–5 watts at 65 mTorr and 9–10 watts at 20 mTorr. ICP power is also applied just above the "backward threshold" power for H-E transition. The backward threshold for H-E transition is typically less than about 300 W for pressure in the range of from 20 to 100 mTorr. Accordingly, the ICP power can be set to 300 W or higher before ignition, but preferably not more than 500–600 W, when used with a vacuum tuned antenna, which might, for example, exhibit 5 kV peak-to-peak voltage at one of its ends.

A synergetic effect of both DC and ICP powers ignites and sustains a plasma at very low power and voltage levels. After ignition both ICP and DC power can be set to process operating levels, or DC power can be switched-off sustaining plasma by ICP power only.

These and other objectives and advantages of the present invention will be more readily apparent from the following detailed description, in which:

DETAILED DESCRIPTION OF THE DRAWINGS

Figure 1:
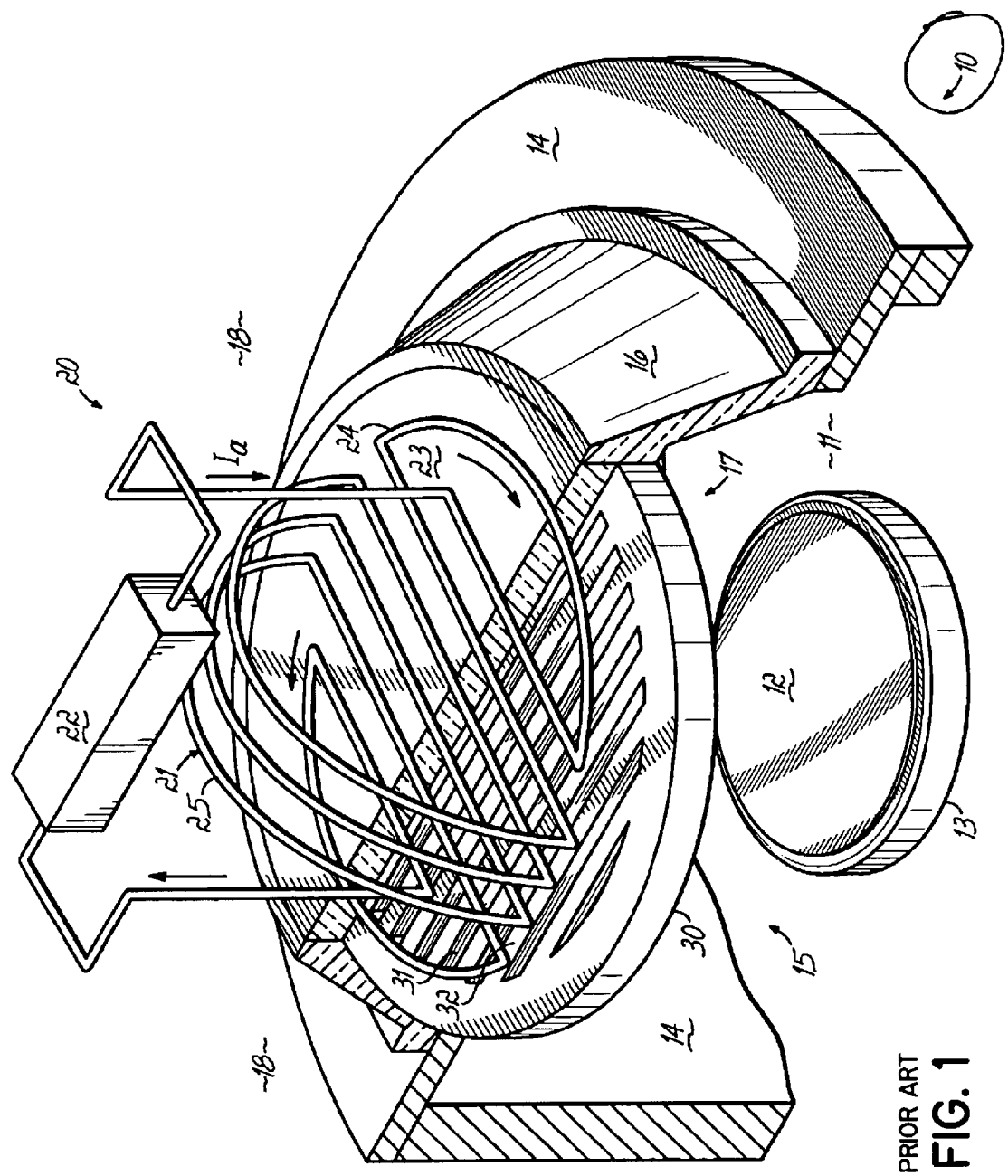
FIG. 1 is a cut-away perspective view of an iPVD apparatus, illustrating components of the prior art.

The invention is described in the context of an iPVD apparatus 10 of the type disclosed in U.S. Pat. No. 6,287,435, as diagrammatically illustrated in FIG. 1. The apparatus 10 includes a vacuum chamber 11 bounded by a chamber wall 14 and having a semiconductor wafer 12 supported for processing therein on an upwardly facing substrate support 13. An ionized sputter material source 15 is situated in the top of the chamber 11 and includes a frusto-conical magnetron sputtering target 16 with an RF energy source 20 situated in an opening 17 in the center of the target 16. The source 20 includes an RF coil or antenna 21 connected to the output of an RF power supply and matching network 22. The coil 21 is located in atmosphere 18 outside of the chamber 11, behind a dielectric window 23 that forms a part of the wall 14 of the chamber 11 that isolates a processing gas maintained at a vacuum inside of the chamber 11 from the atmosphere outside of the chamber 11.

Inside of the window 23 is a deposition baffle 30 of electrically conductive material having, in the embodiment shown, a plurality of parallel linear slots 31 therethrough. Preferably, the baffle 30 is metal. The baffle 30, between each pair of adjacent slots 31, is in the form of an elongated slat 32. The coil 21 has a plurality of parallel conductor segments 24 that lie close to the outside of the window 23 and interconnected by return segments 25 configured so that the currents $I_a$ in the segments 24 flow in the same direction and generate the magnetic field $B_a$ (FIG. 1A) that excites a high density plasma 40 within the chamber 11. The slots 31 in the baffle 30 lie in planes that are perpendicular to the segments 24 of the coil 21. The flux lines of the magnetic field $B_a$ lie in the e planes. These flux lines loop through the slots 31 and around a volume of gas in the chamber 11 adjacent the baffle 30, thereby coupling the RE energy from the coil into the gas within the chamber 11 to sustain the plasma 40 that has been ignited in the gas. This plasma is manifested as a plasma current 41 of charged particles of processing gas that opposes the field from the coil.

Diamagnetic currents $I_s$ that are induced in the baffle 30 at the baffle surface produce a magnetic flux component $B_s$ that causes the resultant magnetic flux lines $B_a$ to curve. The magnetic flux lines $B_s$ enter the slots 31 at the antenna side of the baffle 30 and leave on the opposite side or chamber side of the baffle 30, as illustrated in FIG. 1B. These currents $I_s$ are stronger at the ends 33 of the slots 31 so as to compress the magnetic flux lines into slot 31 as illustrated in FIG. 1C. Expansion of magnetic flux leaving the chamber side of the slots 31 produces surface currents in the opposite direction in the chamber side of the baffle 30 in the region of the ends 33, which contribute to local plasma heating. This edge effect plays a substantial role at the border of the slotted area of the baffle 30 versus the solid portion of the deposition baffle 30.

This edge effect is used advantageously, according to certain aspects of the invention, to effect the overall distribution of power coupled into the plasma 40 within any other portion of the deposition baffle device 30. The position of the ends 33 of the slots 31 with respect to the conductors 24 of the coil 31 affect return current paths and the impedance of the coil 21.

Thickness dimensions of the baffle 30 at the slots also play a role in RF magnetic field transparency of the baffle 30. For example, a greater thickness of the shield 30 may contribute to currents that result in dominant contribution to ohmic losses and increased shielding of the RF magnetic field through the baffle 30. Because of the absence of general solutions for arbitrary slot patterns in the baffle 30, diverse antenna shapes, and different slot thicknesses, simulation experiments and analysis can improve optimal performance of any shield or baffle design. General principles of the invention may be applied in such analysis for improving such design.

Figure 1A:
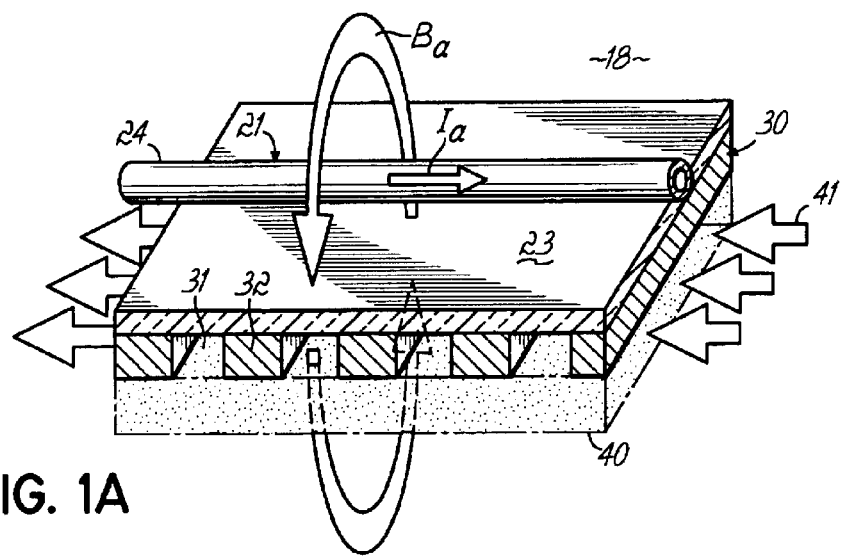
FIG. 1A is diagrammatic perspective view of a section of the apparatus of FIG. 1 showing instantaneous RF field and current vectors.
Figure 1B:
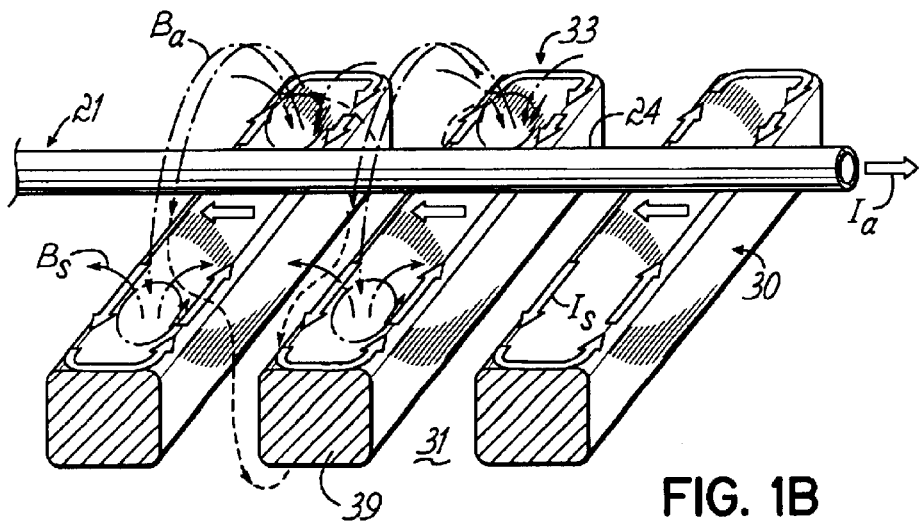
FIG. 1B is a view, similar to FIG. 1A illustrating such vectors in the center of a deposition baffle.
Figure 1C:
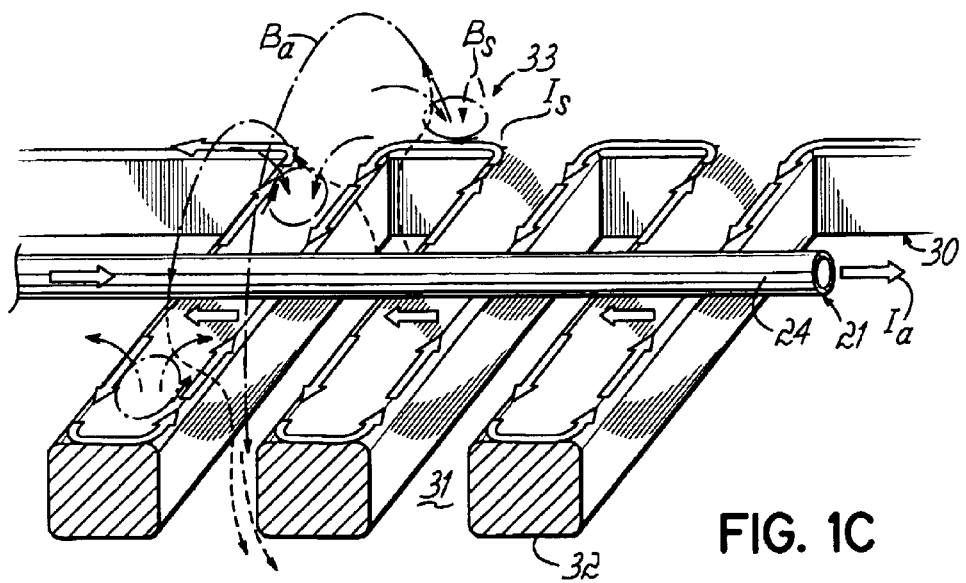
FIG. 1C is a view, similar to FIG. 1B illustrating such vectors at the ends of the slots of the deposition baffle.

The principles of this invention are described in the context of the ionized PVD source of FIG. 1, but the invention has general applicability to other uses of ICP sources.

In ICP sources, to prevent coating the dielectric window 23 with plasma products and metal atoms, the slots 31 of the shield 30 are typically provided with slot structure presenting no line-of-sight path from the plasma to the window. Such slots may, for example, be chevron shaped or have some other suitable shape to accomplish this. For simplicity, in FIG. 1A, a rectangular cross section is schematically shown.

Figure 2A:
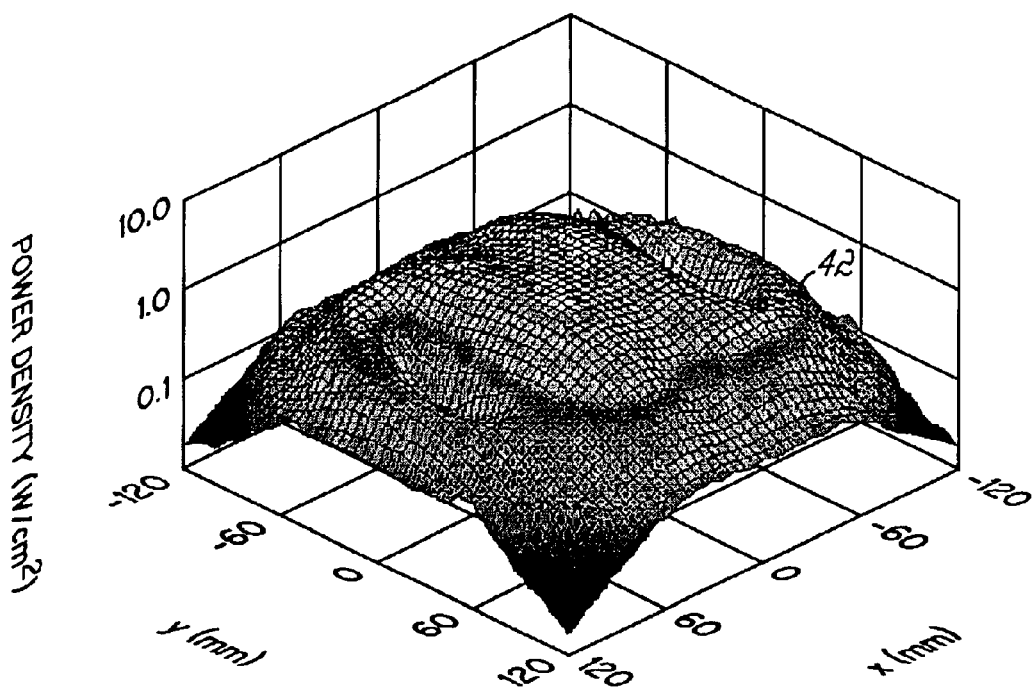
FIG. 2A is a three-dimensional plot of the RF power density distribution in the chamber of the apparatus of FIG. 1 without a deposition baffle.
Figure 2B:
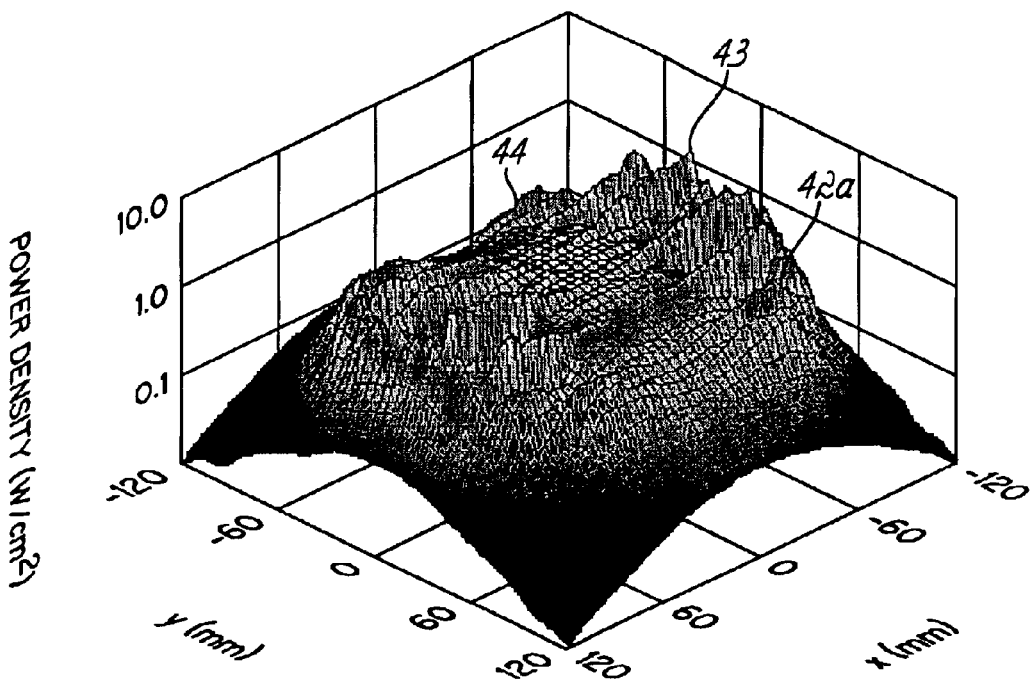
FIG. 2B is a three-dimensional plot of the RF power density distribution in the chamber of the apparatus of FIG. 1 with a deposition baffle.

In such a source as illustrated in FIGS. 1–1C, the power density distribution 42 in the plasma 40 immediately inside of the window 23, without the deposition baffle 30, would be produced as shown in FIG. 2A. However, with the deposition baffle 30, a power density distribution 42a, as illustrated in FIG. 2B, would be produced inside of the window 23, adjacent to the chamber side of the deposition baffle 30. The distribution 42a has sharp peaks 43 adjacent the ends 33 of the slots 31 of the baffle 30 with magnitudes that can be even higher than adjacent the center 44 of deposition baffle 30. Such a baffle 30 causes the power density distribution 42 to be modified to the distribution 42a by the formula:

$$P_{PLASMA}(X,Y,Z)=K_{BAFFLE}(X,Y,Z) \times P_{ANTENNA}(X,Y,Z).$$

The factor $K_{BAFFLE}(X,Y,Z)$ represents the effects of ohmic losses, slot geometry and edge effects on the EM field. It represents azimuthal asymmetry of the plasma source. Hot spots closely located to the ends 33 of slots 31 produce locally more intense plasma. This can result in enhanced erosion of the target, which shortens the life of the target and thus increases the cost of ownership of the tool. Moreover, such non-uniform erosion rate may produce an oval pattern in film deposited on the substrate due to the varying thickness of deposited film on the substrate.

Because it is neither straightforward nor practical to remove the ends of slots 31 from deposition baffle 30, an approach of the present invention is to distribute the edge effect over the baffle by intentionally creating the edge effect across the deposition baffle surface. Furthermore, by creating this effect on the side of the baffle 30 that faces toward the plasma 40, adverse effects of this approach are minimized. This is achieved by connecting individual slats together with metallic bridges in certain positions and thereby emulating "quasi ends" of slots 31 at various points along the slots 31.

Typically, those who are familiar with RF fields will avoid introducing bridges across the slots to avoid magnetically shielding the coil and reducing the propagation of the RF magnetic field from the coil into the plasma, and thereby reducing deposited power density into the plasma, producing diminished plasma density. In the extreme case of using very short slots and too many such bridges, a simple perforated EM shield could be produced, for example, that would block all magnetic coupling from the coil into the plasma. The present invention takes several steps to overcome this otherwise expected result.

Figure 3A:
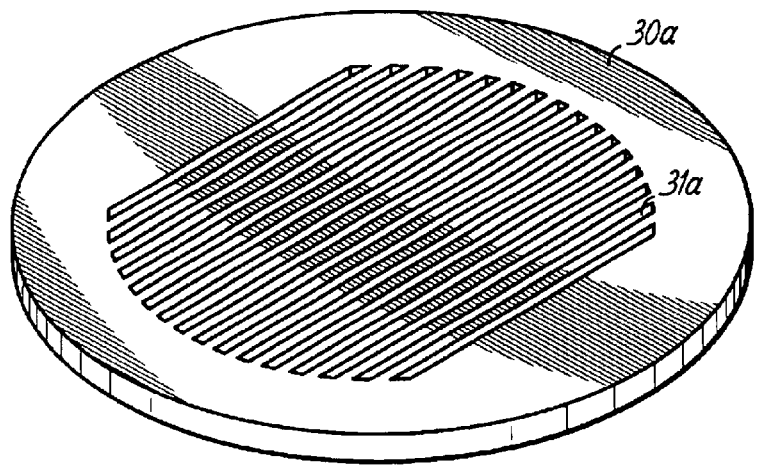
FIG. 3A is a perspective view showing the window side of a deposition baffle according to one embodiment of the present invention.
Figure 3B:
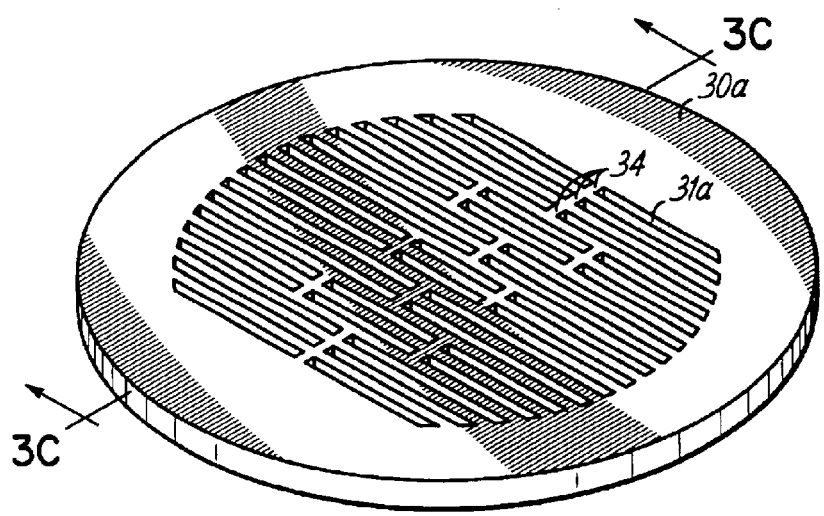
FIG. 3B is a perspective view showing the chamber side of a deposition baffle of FIG. 3A.
Figure 3C:
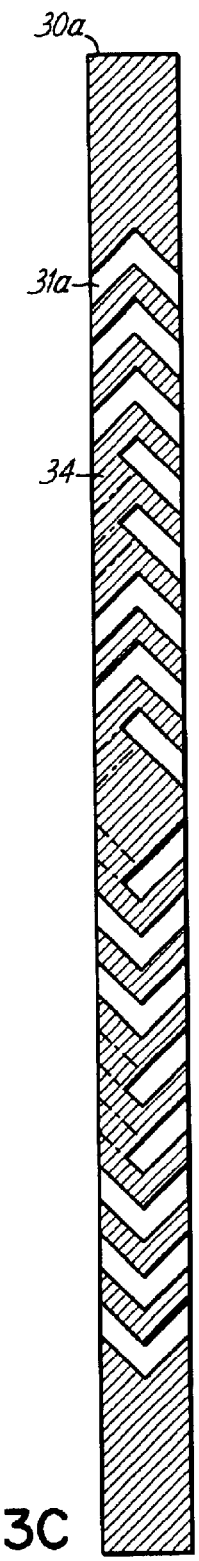
FIG. 3C is a cross-sectional view through the deposition baffle of FIG. 3B taken at line 3C—3C.

Steps taken by the present invention provide a deposition baffle 30a with increased transparency to the RF magnetic field from the coil and provide bridges 34 in a way that does not significantly increase return currents across the slots, as illustrated, for example, in FIG. 3A–3C.

Increased transmission of RF magnetic fields through the deposition baffle device is achieved in part by providing an increased number of the slots. The baffle 30 of the prior art source 20 of FIGS. 1–1C has thirteen (13) slots 31. In the baffle 30a, the RF magnetic field from the coil penetrates through the deposition baffle device through slots increased in number to, for example, sixteen (16), as illustrated in FIG. 3A. Such penetration is approximately proportional to the number of the slots 31a, increasing by 24% when changing the number of slots from 13 to 16 and by 43% when increasing the number of slots from 13 to 20. Given the same power density, this increase in number of slots causes an increase in the total deposited power into the plasma, or, alternatively, provides a decrease in current passing through the coil in order to deposit the same power into the plasma. This allows a better redistribution of RF power in the feed lines, including matching networks and cables, etc., thereby reducing losses. From this, a baffle transmission coefficient can be defined as a ratio of average RF electromagnetic energy at the chamber side of the deposition baffle to the value at the input antenna side of the baffle that increases with the number of slots. The width of the slots 31a remains the same as the slots 31, as a reduction in slot width increases ohmic losses in deposition baffle.

The positions and extent of the bridges 34 can affect the coupling of power from the antenna 21 into the plasma 40. Bridges 34 across the chevron shaded slots 31a of deposition baffle 30a, show in FIG. 3B, avoid reducing the coupling of power through the baffle 30a. The bridges 34 are, for example, limited to portions of the slots 31a on the chamber side of the deposition baffle 30a, as shown in FIG. 3C. thereby restricting the return current paths by avoiding paths on the coil side of the baffle 30a. As a result, the antenna 21 does not directly "see" bridges 34 that are on the opposite side of the shield 30a from the coil, avoiding much of the potential interference between the bridges 34 and antenna 21. Bridges 34 on the chamber side of the baffle 30a are farther from the antenna 21, approximately ½ the thickness of baffle 30a farther, where they have less interference with the antenna 21.

The bridges 34 provide enhanced RF grounding of the central portion of the shield, reducing the inductance of the baffle structure, which can improve, and will not detract from, the performance of the baffle. The bridges 34 also enhance shielding of the window from particles coming in a direction parallel to slots 31a, and the bridges create thermal channels in a direction normal to the slots 31a, thus providing the heat flow in a direction normal to the slots, improved radial heat flow, and more effective cooling of baffle.

Figure 4A:
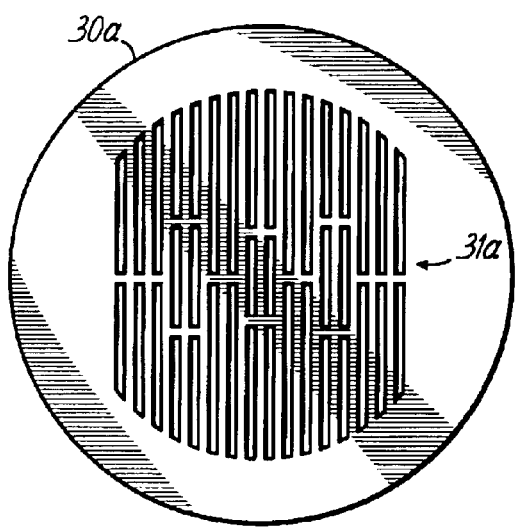
FIG. 4A is a bottom view showing the chamber side of a deposition baffle of FIGS. 3A–D, showing one slot pattern.
Figure 4B:
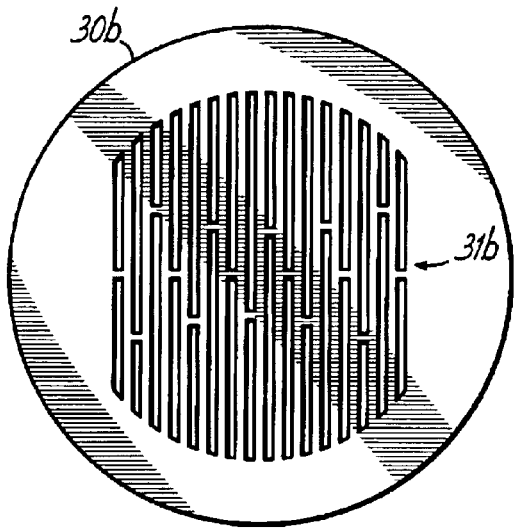
FIG. 4B is a bottom view, similar to FIG. 4A, showing a deposition baffle having an alternative slot pattern.
Figure 4C:
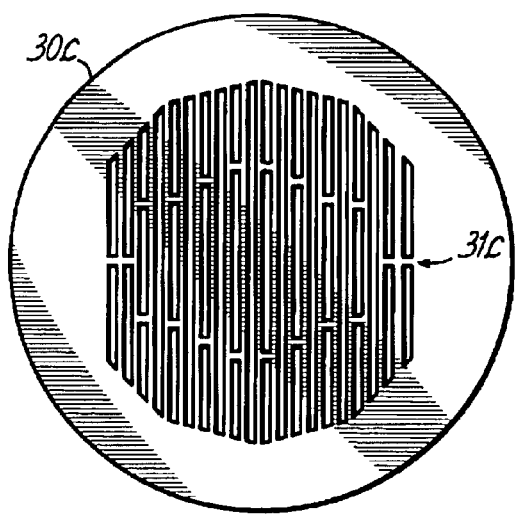
FIG. 4C is a bottom view, similar to FIGS. 4A and 4B, showing a deposition baffle having an alternative slot pattern.

Accordingly, the RF magnetic field from the antenna is not directly affected by addition of the bridges 34 in the slots 31a on the chamber side of shield 30a. Their effect is partially shielded by the top non-bridged structure of the shield 30a. Moreover, the bridges 34 affect the compression of the RF magnetic field on the chamber side of the deposition baffle 30a, creating local spots of increased RF field magnitude. Further, the planar bridge pattern in the plane of the deposition baffle 30a provides a uniform affect on the plasma, offsetting other non-uniformities that are intrinsic to the system. Finite element simulation and analysis will aid in optimizing the placement of the bridges 34. Three examples of deposition baffles 30a, 30b and 30c are shown in FIGS. 4A–4C, respectively, having respective slot variations 31a, 31b and 31c.

Based on simulations, it can further be shown that the resonance frequency of the antenna 21 and deposition baffle, treating the antenna and baffle as a parallel LRC circuit, is affected by the number of slots 31a and other baffle geometry. For example, increasing the number of slots from 13 to 16 and adding the bridges, dropped the resonance frequency of such a circuit from 19 MHz to 15 MHz, much closer to excitation frequency (13.56 MHz). Further reduction of resonance frequency to 13.56 MHz can be achieved by further similar adjustment, whereby RF inductive coupling through the shield would be greatest, and maximal RF power would be coupled from the coil into the plasma.

Figure 5A:
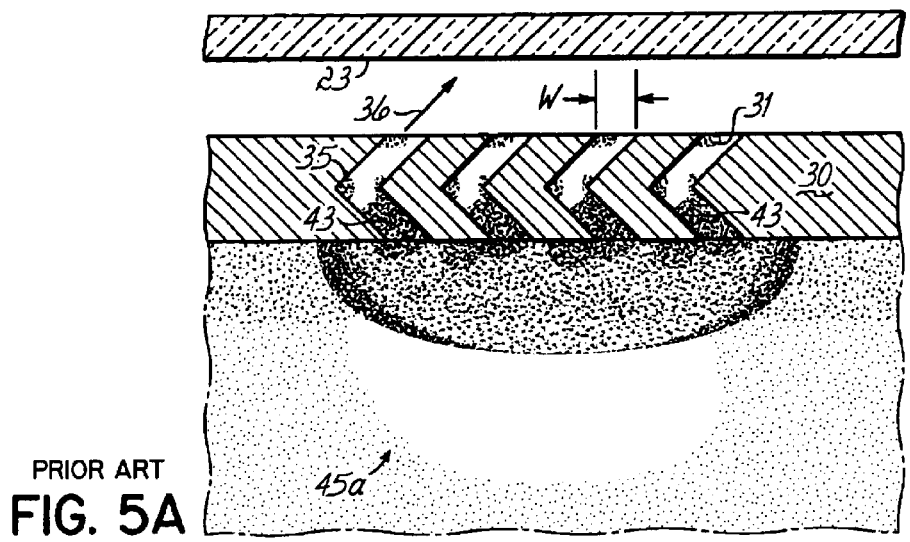
FIG. 5A is a cross-sectional electromagnetic energy density diagram through the source of the apparatus of FIG. 1.

Also, as can be seen in FIG. 5A, to eliminate coating of the dielectric window by plasma products and metal atoms from the plasma, the slots 31 typically are configured so that no line-of-sight path is available from the plasma, through the baffle 30 and onto the window 23. For example, chevron-shaped or other suitably shaped slots 31 are provided, and such slots typically have a width W of several millimeters, for example, 3–6 mm. But even with no line-of-sight path, at pressures of 20 mTorr and above, a certain amount of metal vapor can penetrate through the slots of the deposition baffle and contaminate the dielectric window.

It has been found, for example, that plasma can be generated and sustained within slots 31 if gas pressure is such that the mean free path of gas atoms is smaller than the width of the slot. As a result, RF power can be coupled into the slots 31 to produce a stray plasma 43 in the slots 31 that causes deposits 35 of coating material, which has been intercepted by the walls of the circuitous slot path, to be resputtered from the slots 31 on the window side of the baffle 30, as represented by arrow 36, thus contamination of dielectric window 23. Further, the generation of such stray plasma 43 within the slots 31 increases the fraction of RF power transferred into losses within the deposition baffle 30, which increases the temperature locally.

Figure 5C:
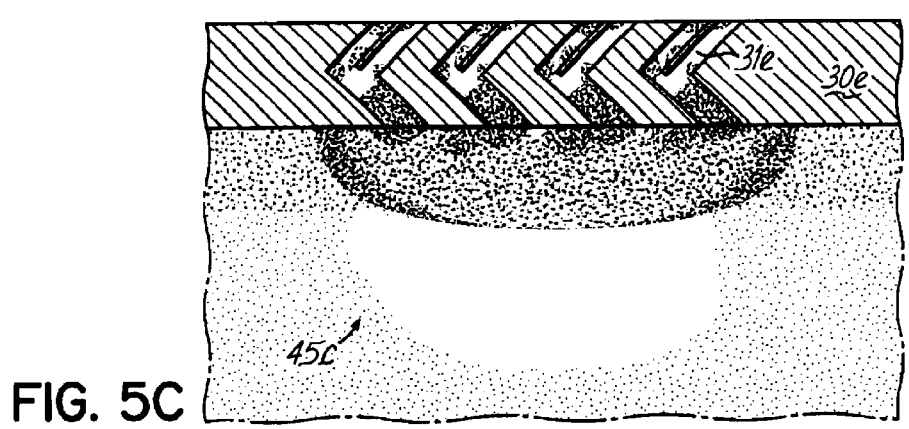
FIG. 5C is a cross-sectional electromagnetic energy density diagram, similar to FIG. 5B, through another embodiment of a source according to the present invention.
Figure 5D:
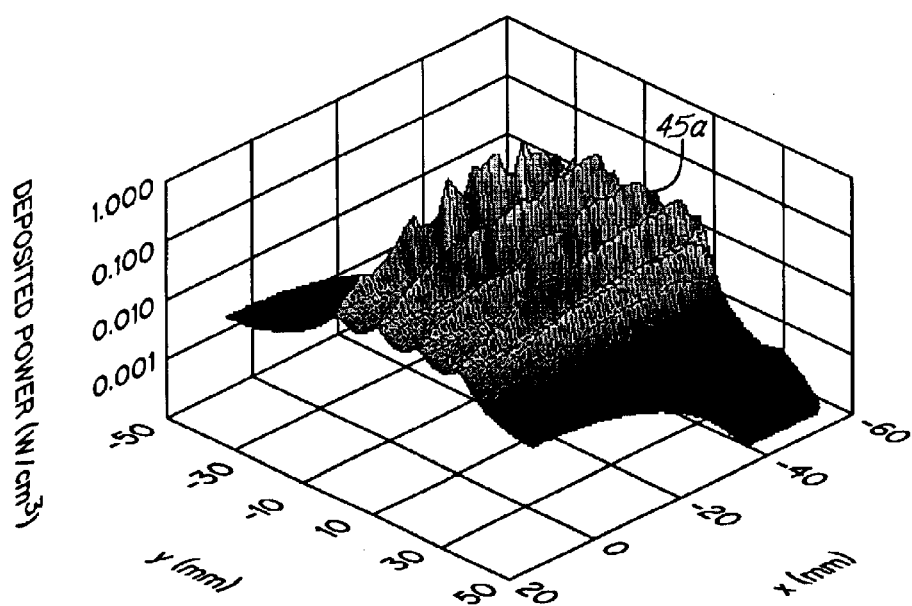
FIG. 5D is a three-dimensional plot of the power density distribution similar to FIG. 2B in the chamber of the apparatus having the source FIG. 5A.
Figure 5B:
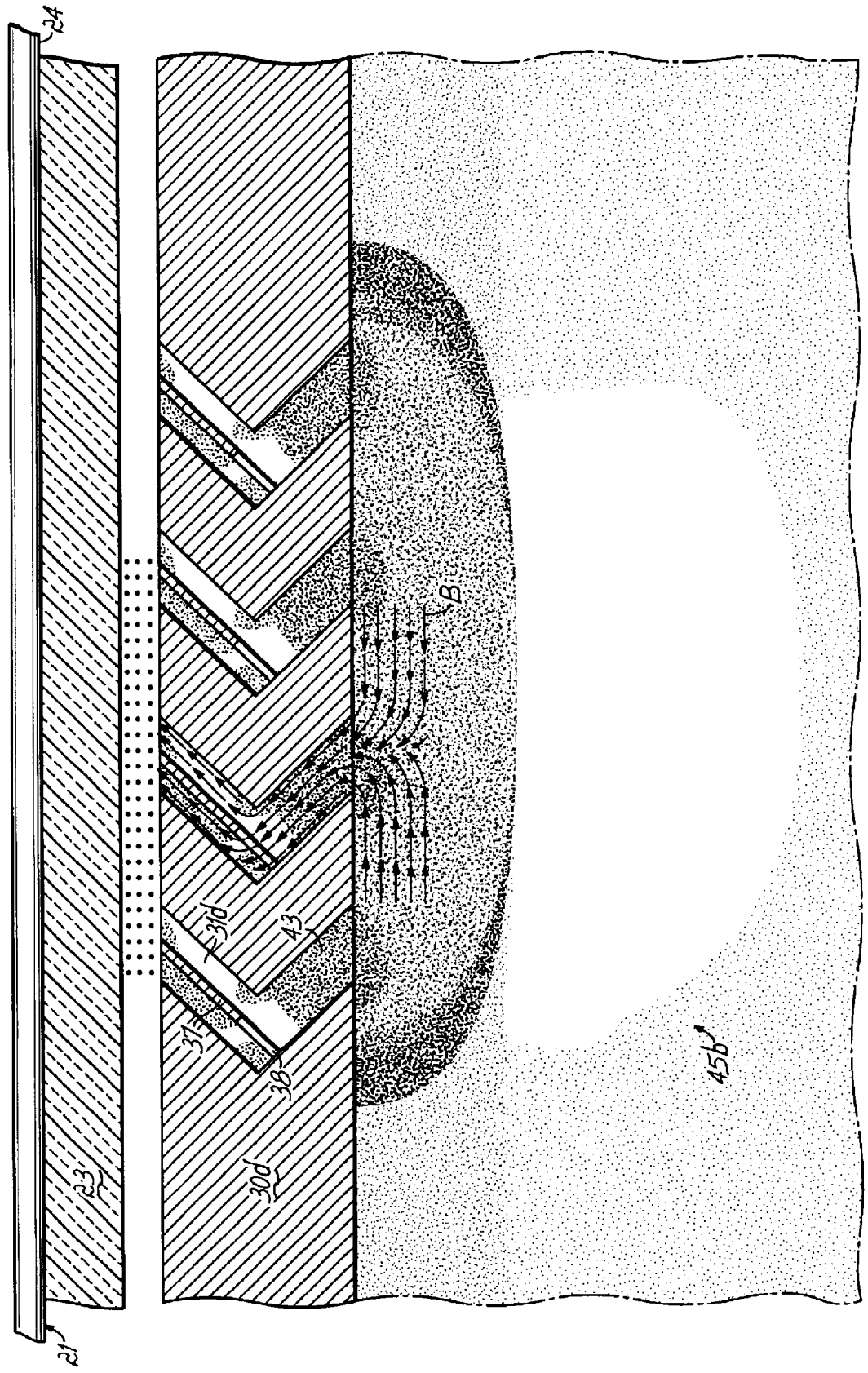
FIG. 5B is a cross-sectional electromagnetic energy density diagram, similar to FIG. 5A, through the one embodiment of a source according to the present invention.

Elimination of the stray plasma 43 is achieved by providing a baffle 30d having modified slot structure 31d, as illustrated in FIG. 5B. The slots 31d each contain a blade 37 within the slot 31d on the dielectric-window side of the baffle 30d. The position of the blade 37, which is formed integrally of the conductive material of the baffle 30d, relative to the conductors 24 of the antenna 21, can create return current paths in the baffle 30d and affect the impedance of the coil 21. By making the blades 37 thin, such as in the form of narrow slats or lamellas with a thickness around 1 mm or less, placed within the slots 31d close to the dielectric window 23, with minimal connection to the body of the baffle 30d, such return paths are minimized. The RF magnetic field B adequately penetrates the slots 31d having the blades 37.

Specifically, blades 37 are placed in the window side leg of the otherwise chevron-shaped slots 31d as shown in FIG. 5B. The blades 37 enhance physical shielding of the window 23 from particles coming from the stray plasma 43. The blades 37 are connected to a robust portion of the body of the deposition baffle 30d, with blade connection points 38 that are immersed into the bottom or middle side of the deposition baffle 30d, away from antenna 21, closer to the plasma side of the baffle 30d. The antenna 21 therefore "does not see", to any significant degree, these blade connections 38 that are in the bottom/middle portion of baffle 30d, thereby avoiding interference between the blade connections 38 and the antenna 21. The blades 37 are connected to the body of the deposition baffle 30d, thus they are cooled by the thermal channels created through the blade connections 38. The blade connections 38 are in a direction normal to the slots 31d. As such, the positions of the blade connections 38 provide only weak return current paths for currents on the coil side of the baffle 30d.

The blades 37 are not limited in use to only chevron-shaped slots, but can be incorporated into other slot types in a manner similar to that described above. Furthermore, the concept o adding the blades 37 to the slots 31 can be combined with the bridges 34 of FIG. 3A–3C and 4A–4C to achieve the advantages of both such features.

The RF magnetic field from the antenna 21 is not directly affected by the blades 37 where such blades are kept thin and their connections 38 are placed in the chamber side of the shield structure where their effect is partially shielded by the body of deposition baffle 30d itself. The blade connections 38 also lie in the plane of the deposition baffle itself, which provides uniform conditions the plasma. The pattern of the blades 37 can be optimized to a particular system by conducting simulations. Several blade pattern examples are described below, but the possible patterns for various applications is not limited only to those shown.

For example, the average electromagnetic energy density pattern 45a for RF energy transferred through a deposition baffle 30 of the apparatus of FIG. 1, having regular chevron slots 31, is illustrated in FIG. 5A. The energy density pattern 45b for energy transferred through the baffle 30d, having chevron slots 31d that include blades 37 on the window side thereof, is illustrated in FIG. 5B. A further energy density pattern 45c for energy transferred through a baffle 30e, having slots 31e similar to the slots 31d but having increased width, is illustrated in FIG. 5C. Because the presence of the blades 37 slightly reduces the average RF electromagnetic energy coupled into the plasma in baffle 30d, this is compensated for by the relative increase in width of slots 31e in the baffle 30e.

Figure 5E:
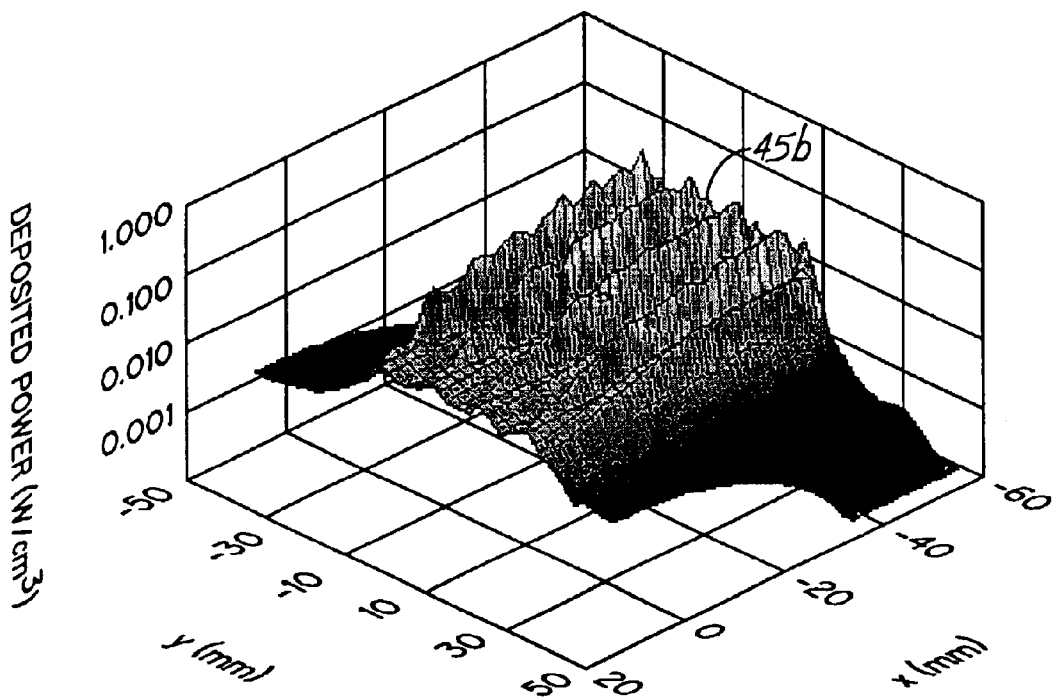
FIG. 5E is a three-dimensional plot of the power density distribution similar to FIG. 5D in the chamber of the apparatus having the source of FIG. 5B.
Figure 5F:
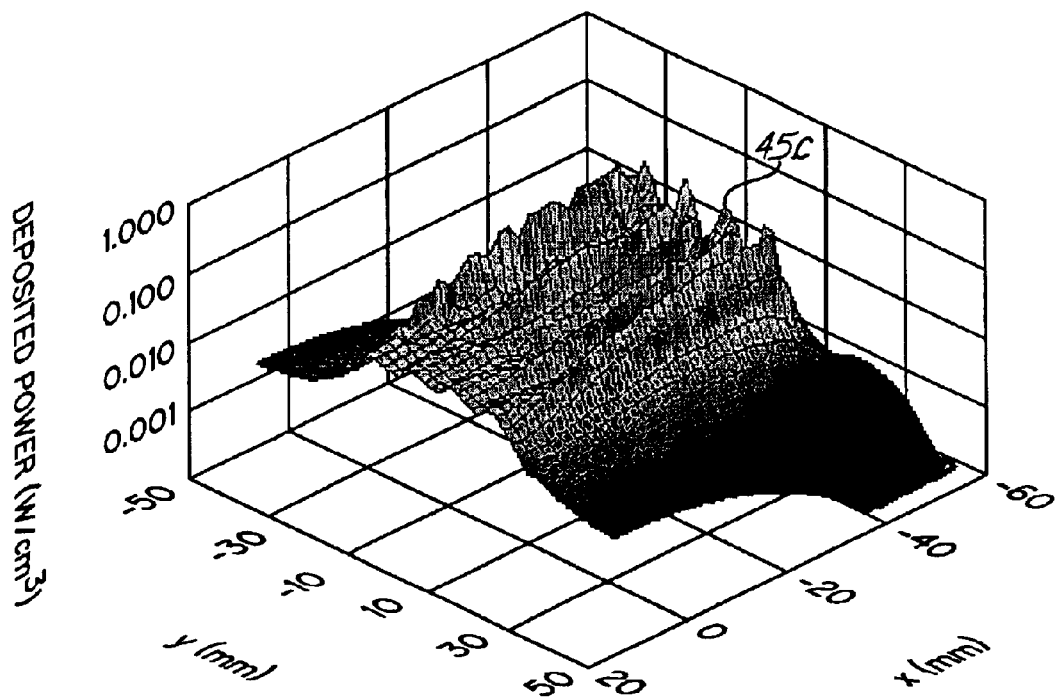
FIG. 5F is a three-dimensional plot of the power density distribution similar to FIGS. 5D and 5E in the chamber of the apparatus having the source of FIG. 5C.

Three-dimensional plots of RF power density distributions 45a–45c, in plasma after passing deposition baffle structures 30 (without blades), 30d (with blades 37 in slots 30d) and 30e (with blades 37 and with increased width slots 31e), are shown in FIGS. 5D–5F, respectively. These distributions 45a–45c are generated using simulation software, and show that no significant modification of the distribution results from adding blades 37 within the slots 31. Similarly, total power deposited into plasma is not materially affected by the blade connections 38 or the number of blade connections 38 per unit of length, based on simulations of the average distance between individual connections 38 over the range of 3.3 cm to 6.7 cm. The average EM energy deposited into the plasma does not change with the number of blade connections 38. However, the electromagnetic energy within the slots 31d increases moderately corresponding to the reduced volume of slots 31d, increasing compression of RF magnetic field, which results in a measurable but insignificant increase in ohmic losses. The relative transmission coefficient for deposited power is shown to be reduced slightly, but the total ratio of the electromagnetic energy in plasma to energy in total volume does measurably not change.

Figure 6A:
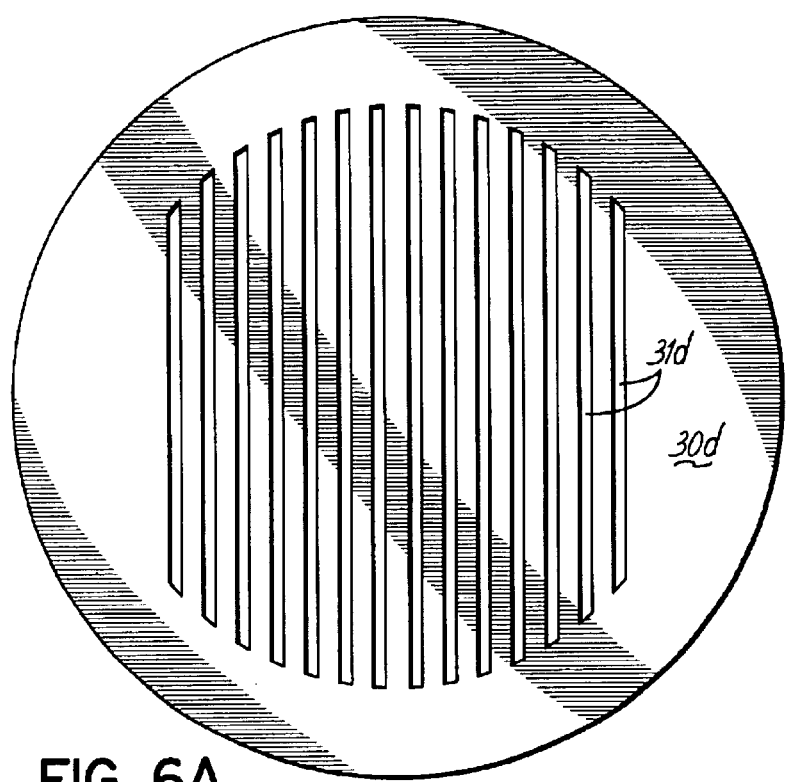
FIG. 6A is a bottom view showing the chamber side of a deposition baffle of FIG. 5B.
Figure 6B:
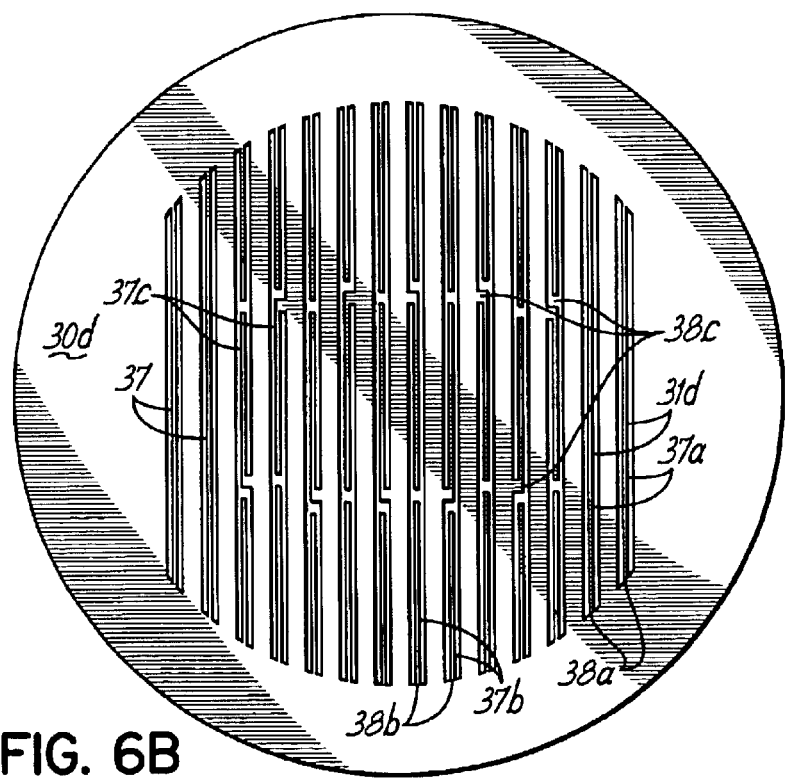
FIG. 6B is a top view showing the window side of a deposition baffle of FIG. 6A.
Figure 6C:
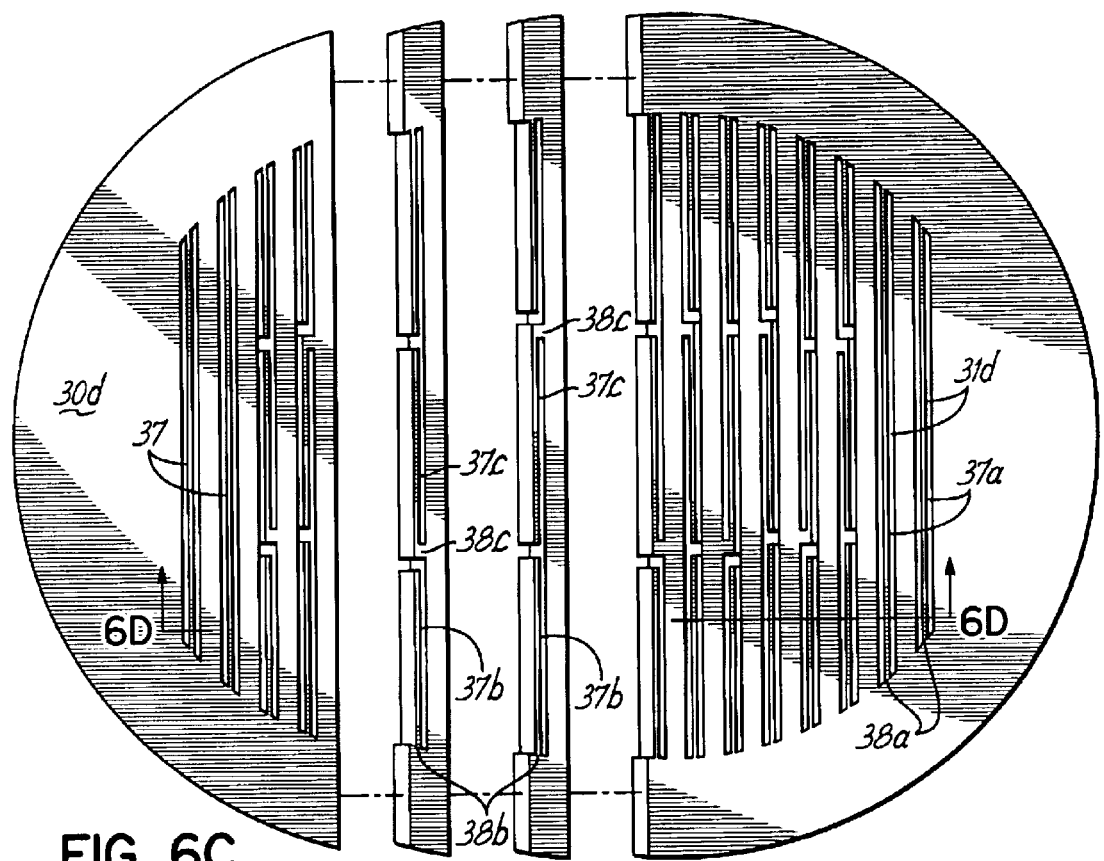
FIG. 6C is a fragmentary top view of the deposition baffle of FIGS. 6A and 6B.
Figure 6D:
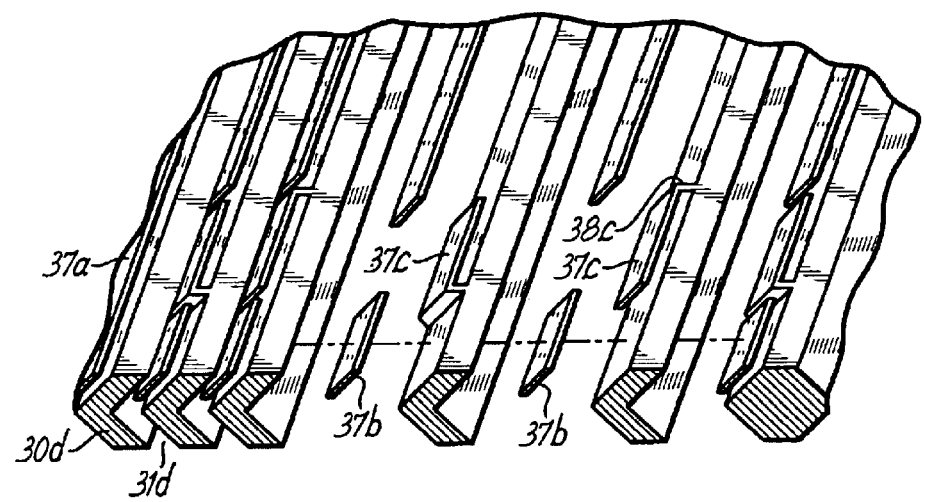
FIG. 6D is a fragmentary perspective view of the deposition baffle of FIGS. 6A–6C taken along line 6D—6D of FIG. 6C.

Incorporation of the blades 37 into one embodiment of the baffle 30d is illustrated in detail in FIGS. 6A–6D. FIG. 6A shows the chamber side of the baffle 30d, in which 14 slots 31d have the same general appearance as slots 31. FIG. 6B illustrates the window side of the same baffle 30d, wherein the blades 37 are visible in the slots 31d. Note that the connection points 38 include connections 38a at the opposite longitudinal ends o the blades 37a that extend the full length of the shorter ones of slots 31d, connections 38b at only one end of the blades 37b that extend only about one-third of the length of the longer ones of slots 31d at an end thereof, and connections 38c at one end of the blades 37c that extend about one-third of the length of the longer ones of slots 31d near the middle thereof. FIGS. 6C and 6D show the construction of the blades 37 in the slots 31d in fragmentary bottom and perspective views.

Figure 6E:
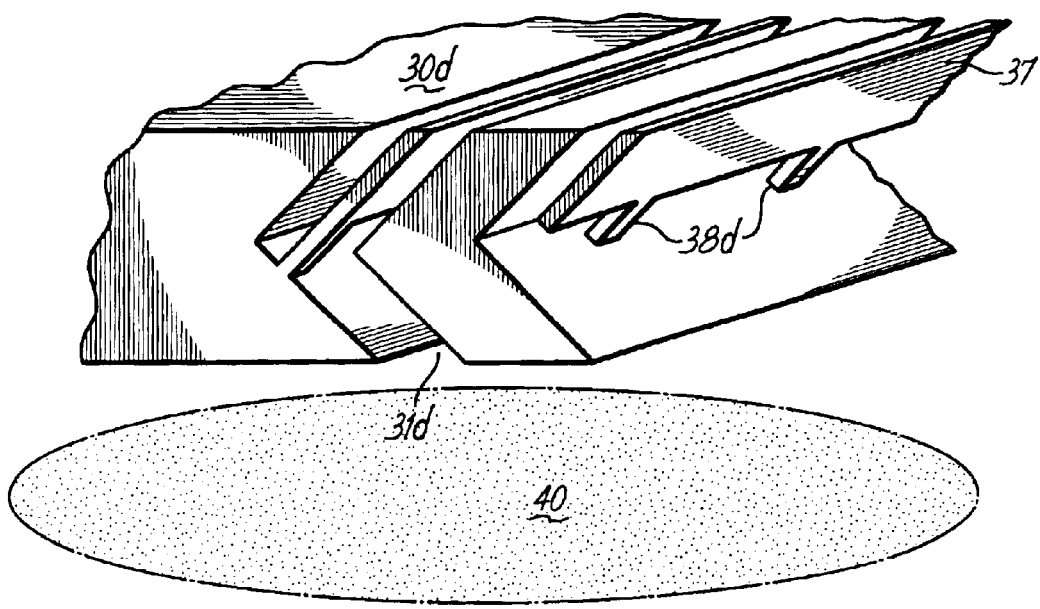
FIG. 6E is a fragmentary perspective view of a portion of the deposition baffle of FIGS. 6A–6D.

An alternative and advantageous incorporation of the blades 37 into the baffle 30d is illustrated in FIG. 6E, wherein the connection points 38d of each blade 37 or blade segment are small cross section posts that join the blades 37 along one side edge to a wall of the portion of the slots 31d that is adjacent the chamber side of the baffle 30d. Furthermore, the connections 38c of FIG. 6B and the connections 38d of FIG. 6E can both be combined together and used to connect the same or different blades to the body of a deposition baffle.

The slots 31d with the blades 37 provide inductive coupling efficiency comparable to that of the chevron-shaped slots 31 without the blades, or to within 95% of original effectiveness of the slots 31. The difference can be compensated for by adding more slots 31d into deposition baffle 30d. In general, the RF power density distribution in the chamber can be moderately affected by the positions of the blade connections 38, but the blade connections 38 do not significantly effect the total power or electromagnetic energy transferred into the plasma. Uniform distribution of blade connections 38 and avoiding closed loops by utilizing single connections only reduces the effects of the blade connections 38 on power density distribution. The orientation of the blades 37 is not expected to materially affect the coupling efficiency into the plasma or the power density distribution.

Employing blades in slots, whether chevron-shaped or otherwise-shaped, has the advantages of eliminating or minimizing plasma presence within the slot and in vicinity to the dielectric window, thereby eliminating or substantially reducing sputtering within the slots and of the dielectric window. The reduction of sputtering from this stray plasma reduces the addition of particle contamination. The blades enhance the shielding of the window from particles from the plasma. Further, the proposed manner of connection of such blades provides low interference of the blades and their connections with the RF antenna.

The electrostatic shielding by the deposition baffle of the coil from the chamber makes plasma ignition difficult. Plasma in the described apparatus is ignited and sustained with very low RF power coupled to the antenna (approximately 300 watts, for example) and a low DC power level at the target of about several watts, e.g. at least 4 W and 9 W at 65 mTorr and 20 mTorr, respectively. In an etching system or other system having no target, the separate electrode, such as the baffle itself, can be used instead of the target for plasma ignition. For iPVD, for example, it is natural to use the target as the electrode, where the DC needed for ignition involves only setting power levels. In other systems such as etching, it is necessary to provide another electrode, such as, for example, a small flat electrode, or wire-cylindrical electrode that would be used for plasma striking. The baffle itself can be used if it is not grounded, or if it can be separated from ground for the short period when it is biased by low power DC. For example in etchers, a so called "focusing ring" that is often provided to improve etch uniformity can be used. Requirements for such electrode should be (1) that it is made of low sputtering yield material to not contaminate the process chamber by electrode material (for example Pt, Ni, Mo, W, Ta), (2) that it withstand high temperature, (3) that it provide good electron emission from its surface, and (4) that it be incorporated in a place where it is not exposed directly to the hottest plasma, for example, part of the wall, part of the internal shield, or deposition baffle.

For plasma ignition, in addition to the low DC power level, an ICP power is applied at the same time to the antenna at a level just above the "backward threshold" power for H-E transition. Such DC power alone is not enough to sustain plasma at such low power levels. Such low DC power level provides a very small amount of individual electrons of sufficient energy to strike a plasma by ionizing neutral atoms and producing secondary electrons and ions. However, these secondary electrons do not gain enough energy to produce another ionization act, which is needed for a plasma to be sustained. Neither is the ICP power alone, at the "backward threshold" level, enough to ignite the plasma.

H-E transition is an event that is typical of inductive discharges, which exhibit two modes of operation (1) the true inductive discharge known as the H mode, and (2) a weak capacitive discharge known as E-mode. H-E (or E-H) transition is transition from inductive coupling to capacitive coupling (or vice versa). When gradually increasing ICP RF power, at a low power level there is only capacitive coupling (E mode) of the antenna to the plasma, and the plasma is excited by the electric field produced by the antenna; the RF magnetic fields (H) of the antenna are low and do not induce electric fields inside the plasma that would be sufficient to sustain the plasma. Plasma density is considered as low density ($N_e \sim 10^9$–$10^{10}$ cm$^{-3}$) and is generated by the electric field (E, electrostatic regime) that is related to antenna surface as a capacitive electrode. With increasing RF power, the discharge abruptly shifts from a low-density capacitive mode to a high-density inductive mode as the antenna generates intense RF magnetic fields, in the H electromagnetic regime due to the coil inductance, that induce strong electric fields inside plasma. This electric field is not related to any surface of the antenna, but it is strong enough to produce plasma densities in range from $N_e \sim 10^{11}$–$10^{12}$ cm$^{-3}$. Experimentally, the transition between these modes as coil current (RF power) is increased is clear and is marked by a large increase in plasma density and optical emission occurring as the H mode appears. Usually, the RF power level required to jump from low-density to high-density (or vice versa) differs more or less for upward transition (E-H) and downward transition (H-E), creating hysteresis of H-E transition. So, in ICP systems, at a low RF power level, most of the energy flows through capacitive coupling and inductance of the antenna does not play a role, at a high RF power level the antenna's inductance has played a dominant role and most energy flows through an inductive coupling mechanism, which is more effective than a capacitive one, e.g. it produces a high-density plasma. At intermediate RF power level there are both mechanisms, usually within the hysteresis curve.

The "backward" threshold for H-E transition is the reverse H-E transition threshold on the hysteresis curve. In a system with a deposition baffle that operates as an electrostatic shield, the true inductive plasma (H mode) is ignited only in the region above the forward E-H transition on the hysteresis curve and will extinguish in the region below the reverse H-E transition on the hysteresis curve.

The "backward threshold" for H-E transition is less than 300 W for pressures in the range of from 20 mTorr to 100 mTorr. That means the ICP power should be set at least to 300 W before ignition, but not more than the power that would cause a vacuum tuned antenna to exhibit 5 kV or more of peak-to-peak voltage at one of its ends. For the antenna illustrated, this upper limit is around 500–600 W, as illustrated in FIG. 7A.

The reason that 300 watts of ICP power is desirable for plasma ignition is to sustain low voltages in the system and to avoid damage, or by providing softer ignition, reducing the likelihood of arcing, for example, at the atmospheric side of the window. Atmospheric side arcing occurs at about 3.5 kV/mm for DC voltages. When RF is used instead of DC, this limit is typically lower and depends on many factors. 500–600 watts of ICP power can be used safely for plasma ignition, but at 1 kW the probability of atmospheric arcing is higher. Therefore, the power should be less than 1 KW, and preferably not more than 500–600 W, particularly for lower pressure operation of, for example, below 20 mTorr. 500–600 watts of ICP power can be used safely at pressures above 20 mTorr, with 10 mTorr probably being the safe lower pressure limit for efficient ICP ignition at low DC power. Below 300 watts ICP power, plasma either may not ignite well or may not be sustained in "true inductive mode". Higher ICP powers of up to 600 watts helps ignite an inductive plasma using values of DC power at a target of up to 25–30 watts. But the plasma should not be ignited and sustained by higher DC power at a target only, as this produces voltage spikes in the absence of special electronic controls, as described in Lantsman U.S. Pat. No. 6,190,512, which spikes can produce damage to the equipment and contamination of the chamber and substrate by sputtered material. 10 mTorr is the likely limit for efficient ICP ignition at low DC and ICP powers.

The synergistic effect of both the DC power and the ICP power causes the plasma to ignite and be sustained at very low power and voltage conditions. After ignition, both ICP and DC power can be set to process operating levels, or DC power can be switched-off sustaining plasma by the ICP power only. The example of power levels required to ignite and sustain plasma in argon gas in a plasma processing system for iPVD are shown in experimental data as plotted in FIG. 7B, in which the arrows show from which DC power level plasma is ignited and sustained at two different pressures.

The empirical estimate of minimal DC power levels is approximately given by the following formula, which is valid within pressure range from 20 to 100 mTorr of argon gas:

$$P_{DC}(W) \geq \frac{100}{p(mTorr)} + 3$$

This formula is only approximative, as different power levels may be required when target material is changed, different working gas is used, or hardware components are modified, but the principles discussed herein will remain the same.

Figure 7D:
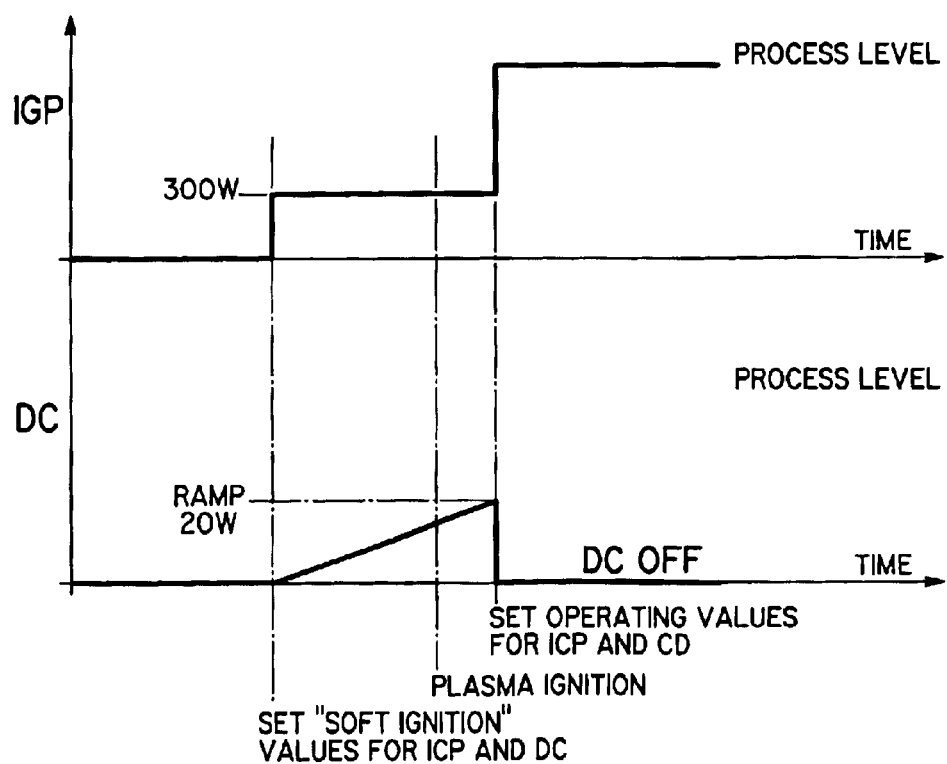
FIG. 7D is a graph of DC and ICP plasma ignition power in a PVD system according to certain principles of the present invention.
Figure 7A:
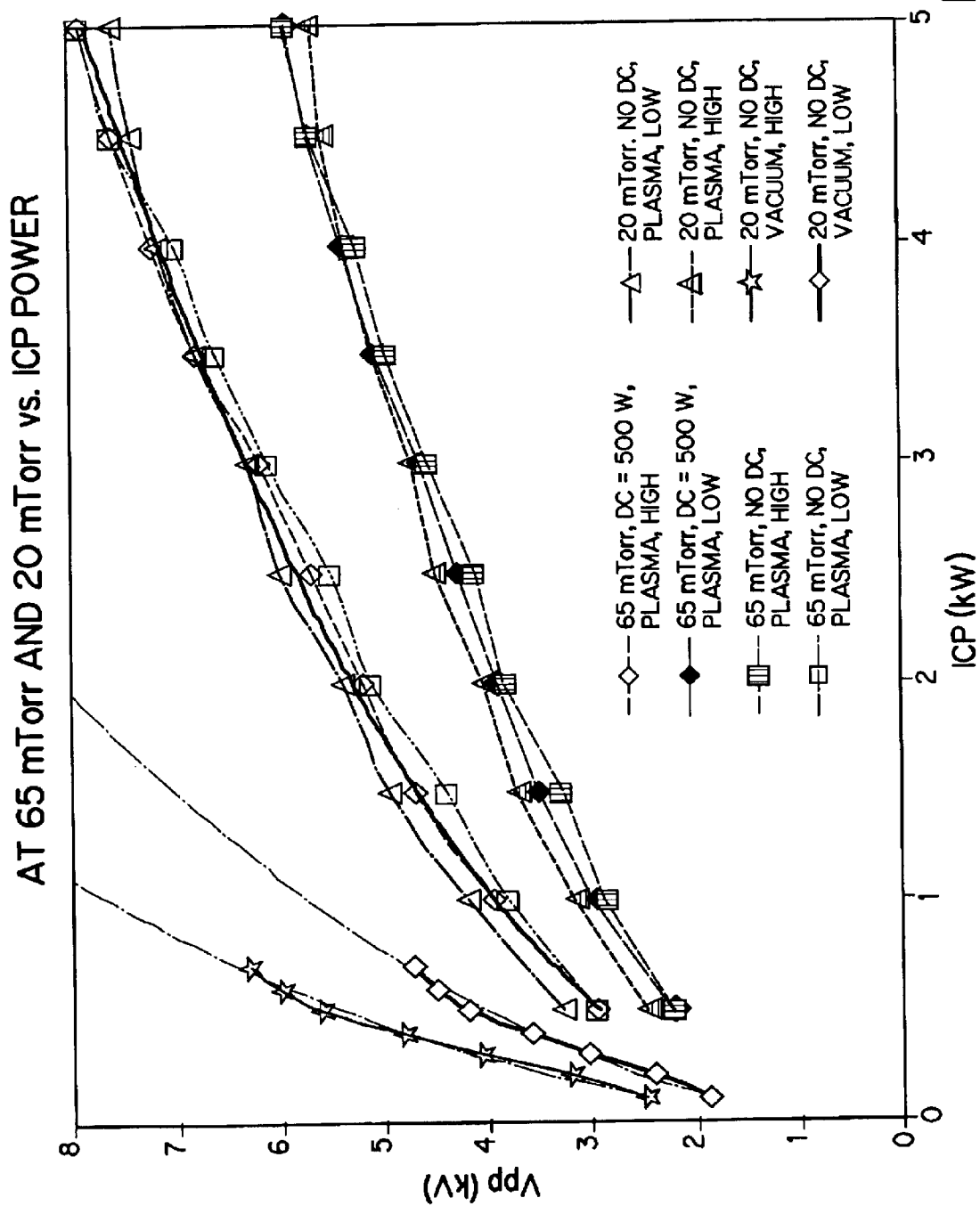
FIG. 7A is a graph showing peak voltage as a function of ICP power for various plasma ignition conditions.
Figure 7B:
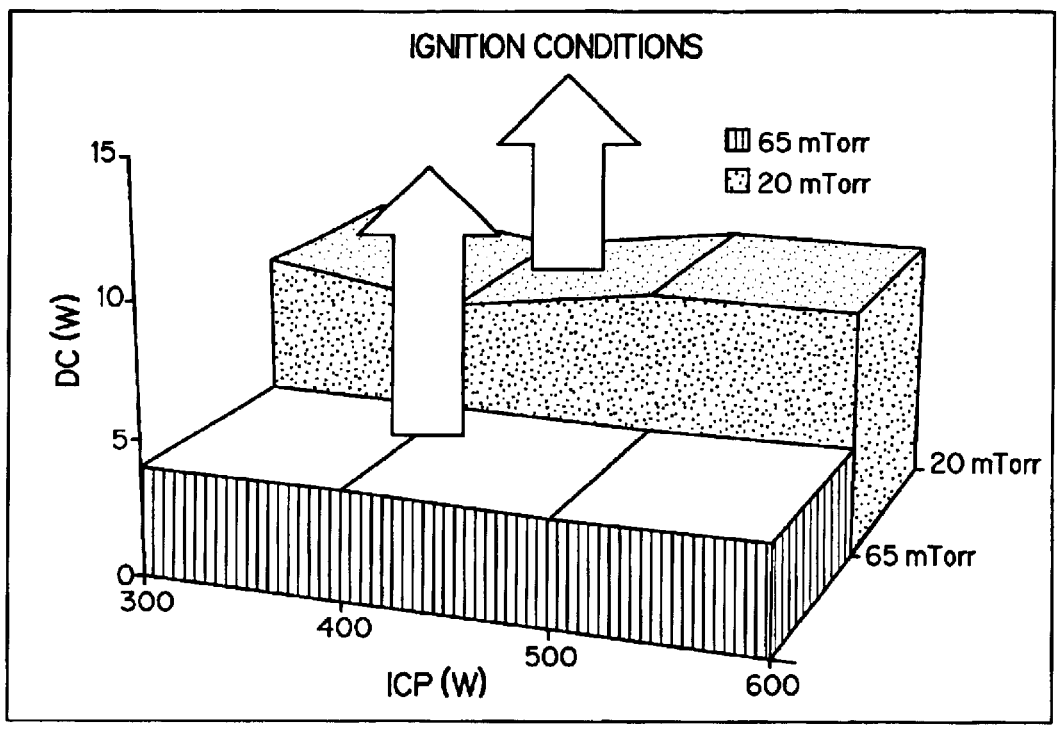
FIG. 7B is a three-dimensional graph showing DC power as a function of ICP power and pressure.
Figure 7C:
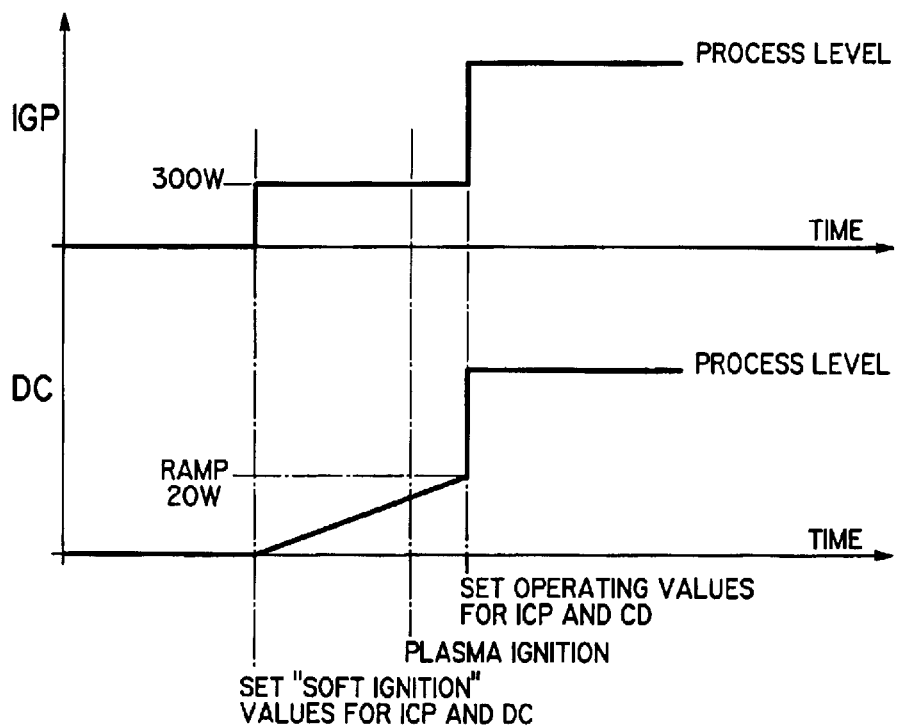
FIG. 7C is a graph of DC and ICP plasma ignition power in a PVD system according to certain principles of the present invention.

Ignition and plasma sustaining procedures are shown in FIGS. 7C for PVD systems in which there is a target and in FIGS. 7D for etch systems or for plasma cleaning processes in which a target is not being used. The sequence in FIG. 7C is used for plasma ignition and subsequent ionized PVD processing, while the sequence in FIG. 7D is used for low power ignition and subsequent ICP-only based processes. Detailed description of the procedure is in Table 1.

TABLE 1

| | | Ignition Procedure | |
| --- | --- | --- | --- |
| STEP | IPVD PROCESS | ICP ONLY | COMMENT |
| 1. | Set ICP power to at least 300 W, but less than 600 W. | Set ICP power to at least 300 W, but less than 600 W. | At lower pressure, set higher ICP power value and vice versa. |
| 2. | At the same instant as step 1 or later set ramping of DC power from 0 to 20 W. Duration of ramp is several seconds. | At the same instant as step 1 or later set ramping of DC power from 0 to 20 W. Duration of ramp is several seconds. | From 1 to 5 seconds in dependence on process requirements. |
| 3. | Plasma will get ignited at intermediate DC power level within interval 0 to 20 W. | Plasma will get ignited at intermediate DC power level within interval 0 to 20 W. | At pressure 65 mTorr DC = 5 W; At 20 mTorr DC = 10 W. |
| 4. | Set parameters required for process conditions: Set ICP power level Set DC power level | Set parameters required for process conditions: Set ICP power level Ramp down to 0 W or switch-off DC power | Process parameters can be set as stepwise function or by ramping power values. |
| 5. | Process substrate. | Process substrate. | |

TABLE 1-continued

Ignition Procedure

| STEP IPVD PROCESS | ICP ONLY | COMMENT |
|---|---|---|
| 6. Switch-off DC and ICP power levels. | Switch-off ICP power. | |

Those skilled in the art will appreciate that the application of the present invention herein is varied, that the invention is described in exemplary embodiments, and that additions and modifications can be made without departing from the principles of the invention. Therefore, the following is claimed:

What is claimed is:

1. A deposition baffle for protecting a dielectric window in a plasma processing chamber while facilitating inductive coupling of RF energy from a coil outside of the window, through the window and baffle, and into a plasma within the chamber, comprising:

an electrically conductive body having a window side and a plasma side;

the body having plurality of slots extending therethrough between the sides thereof;

the slots having walls defined by surfaces of the body and configured to block line-of-sight paths through the body for particles in the chamber moving from the plasma side of the body to the window side of the body;

a plurality of the slots each having an electrically conductive bridge therein fixed to the body and electrically interconnecting opposite walls of the slot to thereby interrupt the slot, on substantially only one of said sides of the body; and the bridges having connections to the body distributed on the baffle so as to improve the uniformity of the distribution of power coupled into the plasma through the baffle without limiting the effectiveness of inductive coupling through the baffle.

2. The baffle of claim 1 wherein:

the slots have chevron-shaped cross sections.

3. The baffle of claim 1 wherein:

the brides interrupt the slots on the plasma side of the body.

4. An inductively-coupled-plasma source for inductively coupling RF energy into a plasma processing space within a plasma processing chamber, comprising:

a dielectric window in a wall of the plasma processing chamber;

a coil outside of the window and connected to an RF power source;

a deposition baffle inside the plasma processing chamber and closely spaced from the dielectric window, between the plasma processing space and the window, the baffle having a body having a plurality of slots extending therethrough;

the slots being configured such that surfaces of the body bounding the slots block line-of-sight path through the body for particles moving from the plasma processing space toward the window; and a plurality of the slots each having an electrically conductive bridge therein fixed to the body and electrically interconnecting opposite walls of the slot to thereby interrupt the slot, on substantially only one of said sides of the body.

5. The source of claim 4 wherein:

the bridges have connections to the body distributed on the baffle so as to improve the uniformity of the distribution of power coupled into the plasma through the baffle without limiting the effectiveness of inductive coupling through the baffle.

6. The source of claim 4 wherein:

the slots have chevron-shaped cross sections.

7. The source of claim 4 wherein:

the bridges interrupt the slots on the side of the body toward the plasma processing space.

8. The source of claim 4 wherein:

the baffle and the coil form an RF circuit having a resonant frequency approximately at the frequency of the RF source.

9. A plasma processing apparatus comprising a vacuum chamber, a substrate support within the chamber, and the inductively-coupled-plasma source of claim 4.

10. The apparatus of claim 9 further comprising:

a controller programmed to control the apparatus to ignite a plasma within the plasma processing space according to a plasma ignition method that includes the steps of:

energizing the coil with RF power of at least 300 watts, but less than 600 watts;

then, ramping DC power to an electrode coupled to the plasma processing space from 0 watts to up to level of not more than approximately 20 watts over a period of several seconds and thereby igniting a plasma within the processing space;

upon ignition o the plasma, revising the RF power and the DC power to substrate processing parameters;

maintaining substrate processing parameters while processing a substrate; and processing a substrate in the plasma processing space.

11. The apparatus of claim 10 wherein:

the chamber has a sputtering target therein that forms said electrode; and, the revising of the DC power includes setting the DC power to the target at a sputtering power level.

12. The apparatus of claim 10 wherein:

the ramping o the DC power includes ramping the power to a level that varies inversely with pressure in the chamber according to a relationship that produces approximately 5 watts when the pressure is approximately 65 mTorr and approximately 10 watts when the pressure s approximately 20 mTorr.

13. The source of claim 4 wherein:

the bridges have connections to the body distributed on the baffle so as to improve the uniformity of the distribution of power coupled into the plasma through the baffle without limiting the effectiveness of inductive coupling through the baffle; and the bridges interrupt the slots on the side of the body toward the plasma processing space.

14. The source of claim 4 wherein:

the bridges interrupt the slots on the side of the body toward the plasma processing space and have connections to the body distributed on the baffle so as to improve the uniformity of the distribution of power coupled into the plasma through the baffle without limiting the effectiveness of inductive coupling through the baffle; and the baffle and the coil form an RF circuit having a resonant frequency approximately at the frequency of the RF source.

15. A deposition baffle for protecting a dielectric window in a plasma processing chamber while facilitating inductive coupling of RF energy from a coil outside of the window, through the window and baffle, and into a plasma within the chamber, comprising:

an electrically conductive body having a window side and a plasma side;

the body having plurality of slots extending therethrough between the sides thereof;

a plurality of the slots each having an electrically conductive bridge therein fixed to the body and electrically interconnecting opposite walls of the slot to thereby interrupt the slot and form a current conducting path across the slot on substantially only one of said sides of the body.

16. The baffle of claim 15 wherein:

the slots have chevron-shaped cross sections when viewed in a direction parallel to the length of the slots.

17. The baffle of claim 15 wherein:

the bridges electrically interconnect opposite walls of the slots on the plasma side of the body, thereby interrupting the slots on the plasma side of the body.

18. An inductively-coupled-plasma source for inductively coupling RF energy into a plasma processing space within a plasma processing chamber, comprising:

a dielectric window in a wall of the plasma processing chamber;

a coil outside of the window and connected to an RF power source; and the deposition baffle of claim 15.

19. The source of claim 18 wherein:

the connection of the bridges to the body are distributed on the baffle so as to improve the uniformity of the distribution of power coupled into the plasma through the baffle without limiting the effectiveness of inductive coupling through the baffle.

20. The source of claim 18 wherein:

the slots have chevron-shaped cross sections when viewed in a direction parallel to the length of the slots.

21. The source of claim 18 wherein:

the bridges interrupt the slots on the side of the body toward the plasma processing space.

22. The source of claim 18 wherein:

the baffle and the coil form an RF circuit having a resonant frequency approximately at the frequency of the RF source.

23. A plasma processing apparatus comprising:

a vacuum chamber, a substrate support within the chamber, and the inductively-coupled-plasma source of claim 18.

24. The apparatus of claim 23 further comprising:

a controller programmed to control the apparatus to ignite plasma within the plasma processing space according to a plasma ignition method that includes the steps of: energizing the oil with RF power of at least 300 wafts, but less than 600 watts;

then, ramping DC power to an electrode coupled to the plasma processing space from 0 watts to up to level of not more than approximately 20 watts over a period of several seconds and thereby igniting a plasma within the processing space;

upon ignition of the plasma, revising the RF power and the DC power to substrate processing parameters;

maintaining substrate processing parameters while processing a substrate; and processing a substrate in the plasma processing space.

25. The apparatus of claim 24 wherein:

the chamber has a sputtering target therein that forms said electrode; and, the revising of the DC power includes setting the DC power to the target at a sputtering power level.

26. The apparatus of claim 24 wherein:

the ramping of the DC power includes ramping the power to a level that varies inversely with pressure in the chamber according to a relationship that produces approximately 5 watts when the pressure is approximately 65 mTorr and approximately 10 watts when the pressure s approximately 20 mTorr.

27. The apparatus of claim 23 wherein the chamber has a sputtering target therein that forms said electrode and the apparatus further comprises a controller programmed to control the apparatus to ignite a plasma within the plasma processing space according to a plasma ignition method that includes the steps of:

energizing the coil with RF power of at least 300 watts but not more than 600 watts;

then, ramping DC power to an electrode coupled to the plasma processing space up to a level of not more than approximately 20 watts over a period of several seconds and thereby igniting a plasma within the processing space, the ramping of the DC power including ramping the power to a level that varies inversely with pressure in the chamber according to a relationship that produces approximately 5 watts when the pressure is approximately 65 mTorr and approximately 10 watts when the pressure is approximately 20 mTorr; and upon ignition of the plasma, revising the RF power and the DC power to substrate processing parameters and maintaining substrate processing parameters while processing a substrate in the plasma processing space, the revising of the DC power including setting the DC power to the target at a sputtering power level.

28. The source of claim 18 wherein:

the slots have walls defined by surfaces of the body and configured to block line-of-sight paths through the body for particles in the chamber moving from the plasma side of the body to the window side of the body; and the bridges have connections to the body distributed on the baffle so as to improve the uniformity of the distribution of power coupled into the plasma through the baffle without limiting the effectiveness of inductive coupling through the baffle.

29. The baffle of claim 15 wherein:

the slots have walls defined by surfaces of the body and configured to block line-of-sight paths through the body for particles in the chamber moving from the plasma side of the body to the window side of the body.

30. The baffle of claim 15 wherein:

the bridges have connections to the body distributed on the baffle so as to improve the uniformity of the distribution of power coupled into the plasma through the baffle without limiting the effectiveness of inductive coupling through the baffle.

31. The baffle of claim 15 wherein:

the slots have chevron-shaped cross sections when viewed in a direction parallel to the length of the slots; and the bridges electrically interconnect opposite walls of the slots on the plasma side of the body, thereby interrupting the slots on the plasma side of the body.

* * * * *

UNITED STATES PATENT AND TRADEMARK OFFICE
CERTIFICATE OF CORRECTION

| | | |
|---|---|---|
| PATENT NO. | : 6,946,054 B2 | Page 1 of 3 |
| APPLICATION NO. | : 10/080496 | |
| DATED | : September 20, 2005 | |
| INVENTOR(S) | : Jozef Brcka | |

It is certified that error appears in the above-identified patent and that said Letters Patent is hereby corrected as shown below:

Column 1, lines 16-17 read "...energy is inductively coupled through a dielectric material hat is protected by a slotted deposition baffle to energize a..." and should read --...energy is inductively coupled through a dielectric material that is protected by a slotted deposition baffle to energize a...--.

Column 2, line 59 reads "...a magnetic flux normal to the surface o the baffle is increased." and should read --...magnetic flux normal to the surface of the baffle is increased.--.

Column 3, line 4 reads, "...many atoms hay to be ionized to produce ions and electrons..." and should read --...many atoms have to be ionized to produce ions and electrons...--.

Column 3, line 9 reads, "...makes it difficult to ignite a plasma by an electric field ram..." and should read --...makes it difficult to ignite a plasma by an electric field from...--.

Column 3, line 11 reads, "...to produce strange electric fields in its vicinity can result in..." and should read --...to produce stronger electric fields in its vicinity can result in...--

Column 6, line 54 reads, "...field $B_a$ lie in the e planes. These flux lines loop through the..." and should read --...field $B_a$ lie in these planes. These flux lines loop through the...--.

Column 8, line 51 reads, "...Bridges 34 across the chevron shaded slots 31$a$ of deposition..." and should read --...Bridges 34 across the chevron shaped slots 31$a$ of deposition...--.

Column 8, lines 55-56 read, "...side of the deposition baffle 30$a$, as shown in FIG. 3C. thereby restricting the return current paths by avoiding paths..." and should read --...side of the deposition baffle 30$a$, as shown in FIG. 3C, thereby restricting the return current paths by avoiding paths...--.

Column 10, line 28 reads, "concept o adding the blades 37 to the slots 31 can be..." and should read --...concept of adding the blades 37 to the slots 31 can be...--.

Column 11, line 19 reads, "longitudinal ends o the blades 37$a$ that extend the full length..." and should read --...longitudinal ends of the blades 37$a$ that extend the full length...--.

UNITED STATES PATENT AND TRADEMARK OFFICE
CERTIFICATE OF CORRECTION

| | |
|---|---|
| PATENT NO. | : 6,946,054 B2 |
| APPLICATION NO. | : 10/080496 |
| DATED | : September 20, 2005 |
| INVENTOR(S) | : Jozef Brcka |

It is certified that error appears in the above-identified patent and that said Letters Patent is hereby corrected as shown below:

Column 15, CLAIM 4, line 60 reads, "...bounding the slots block line-of-sight path through the..." and should read --...bounding the slots block line-of-sight paths through the...--.

Column 16, CLAIM 10, line 36 reads, "...plasma processing space from 0 watts to up to level..." and should read --...plasma processing space from 0 watts to up to a level...--.

Column 16, CLAIM 10, line 40 reads, "...upon ignition o the plasma, revising the RF power and..." and should read --...upon ignition of the plasma, revising the RF power and...--.

Column 16, CLAIM 12, line 51 reads, "...the ramping o the DC power includes ramping the power..." and should read --...the ramping of the DC power includes ramping the power...--.

Column 16, CLAIM 12, line 56 reads, "pressure s approximately 20 mTorr." and should read --pressure is appoximately 20 mTorr.--.

Column 17, CLAIM 24, lines 63-64 read, "...a controller programmed to control the apparatus to ignite plasma within the plasma processing space according..." and should read --...a controller programmed to control the apparatus to ignite a plasma within the plasma processing space according...--.

UNITED STATES PATENT AND TRADEMARK OFFICE
CERTIFICATE OF CORRECTION

| | |
|---|---|
| PATENT NO. | : 6,946,054 B2 |
| APPLICATION NO. | : 10/080496 |
| DATED | : September 20, 2005 |
| INVENTOR(S) | : Jozef Brcka |

It is certified that error appears in the above-identified patent and that said Letters Patent is hereby corrected as shown below:

Column 17, CLAIM 24, line 66 reads, "...energizing the oil with RF power of at least 300 wafts,..." and should read --...energizing the coil with RF power of at least 300 watts,...--

Column 18, CLAIM 24, line 2 reads, "...plasma processing space from 0 watts to up to level..." and should read --...plasma processing space from 0 watts to up to a level...--

Column 18, CLAIM 26, line 22 reads, "...pressure s approximately 20 mTorr." and should read --...pressure is approximately 20 mTorr.--.

Signed and Sealed this

Nineteenth Day of September, 2006

JON W. DUDAS
*Director of the United States Patent and Trademark Office*